United States Patent [19]

Tomishima et al.

[11] Patent Number: 5,682,343
[45] Date of Patent: Oct. 28, 1997

[54] HIERARCHICAL BIT LINE ARRANGEMENT IN A SEMICONDUCTOR MEMORY

[75] Inventors: Shigeki Tomishima; Masaki Tsukude; Mikio Asakura; Kazuyasu Fujishima, all of Hygo, Japan

[73] Assignee: Mitsubishi Denki Kabushiki Kaisha, Tokyo, Japan

[21] Appl. No.: 664,886

[22] Filed: Jun. 17, 1996

Related U.S. Application Data

[63] Continuation of Ser. No. 288,776, Aug. 11, 1994, abandoned.

[30] Foreign Application Priority Data

Aug. 20, 1993 [JP] Japan .................................. 5-206133
Dec. 22, 1993 [JP] Japan .................................. 5-323805

[51] Int. Cl.⁶ .................................................. G11C 5/06
[52] U.S. Cl. .......................... 365/63; 365/190; 365/203; 365/208; 365/210; 365/230.03; 365/230.06
[58] Field of Search .......................... 365/63, 190, 207, 365/208, 230.03, 230.06, 203, 210, 149

[56] References Cited

U.S. PATENT DOCUMENTS

| | | | |
|---|---|---|---|
| 4,807,195 | 2/1989 | Busch et al. | 365/207 |
| 4,926,382 | 5/1990 | Sakui et al. | 365/210 |
| 4,947,377 | 8/1990 | Hannai | 365/210 |
| 5,140,555 | 8/1992 | Nishiguchi et al. | 365/208 |
| 5,363,331 | 11/1994 | Matsui et al. | 365/230.03 |
| 5,386,394 | 1/1995 | Kawahara et al. | 365/208 |
| 5,424,977 | 6/1995 | Rountree | 365/149 |

FOREIGN PATENT DOCUMENTS

| | | |
|---|---|---|
| 2-263387 | 3/1989 | Japan . |
| 3-52189 | 7/1989 | Japan . |

*Primary Examiner*—Joseph E. Clawson, Jr.
*Attorney, Agent, or Firm*—Lowe, Price, LeBlanc & Becker

[57] ABSTRACT

Main bit lines MBL and ZMBL are disposed at opposite sides of a sense amplifier SA. Main bit lines MBL and ZMBL each are provided for paired sub-bit lines SBL1 and SBL2 (or SBL3 and SBL4). Sub-bit line pair SBL1 and SBL2 is connected to main bit line MBL via a block select switch T1. Sub-bit line pair SBL3 and SBL4 is connected to main bit line ZMBL via a block select switch T2. Since one main bit line is provided for two sub-bit lines, a pitch of the main bit lines is twice as large as a pitch of the sub-bit lines, so that conditions on the pitch of main bit lines are remarkably eased, which facilitates layout of elements.

26 Claims, 27 Drawing Sheets

FIG. 10(a)   WL 
FIG. 10(b)   BS 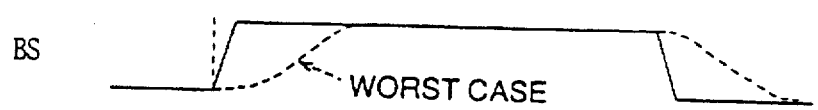
WORST CASE
FIG. 10(c)   MBL (WORST CASE) 
FIG. 10(d)   MBL 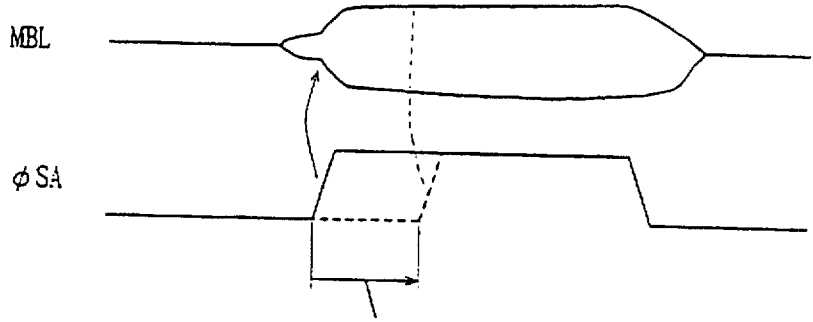
FIG. 10(e)   φSA 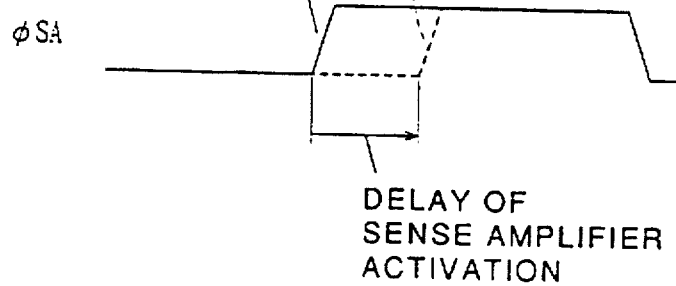
DELAY OF SENSE AMPLIFIER ACTIVATION

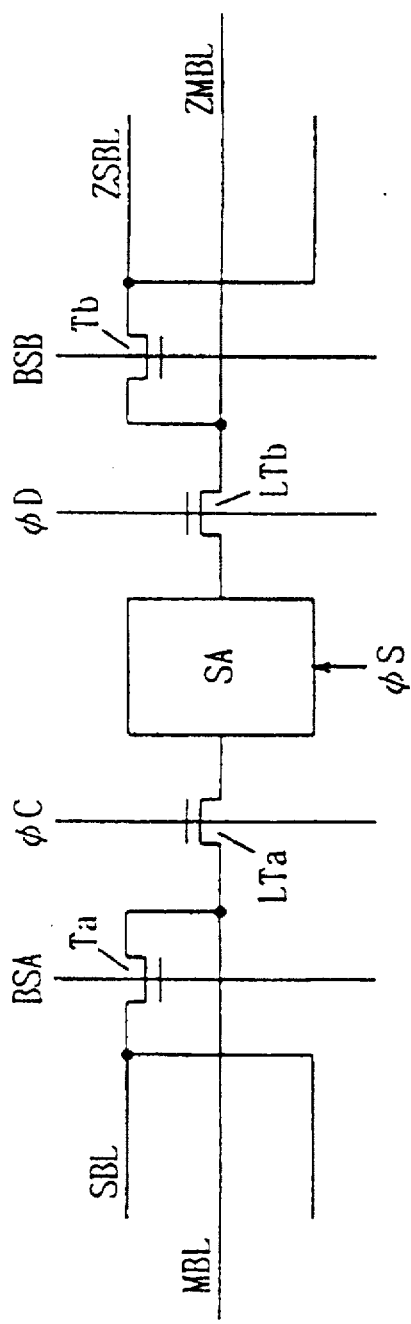
FIG. 25A
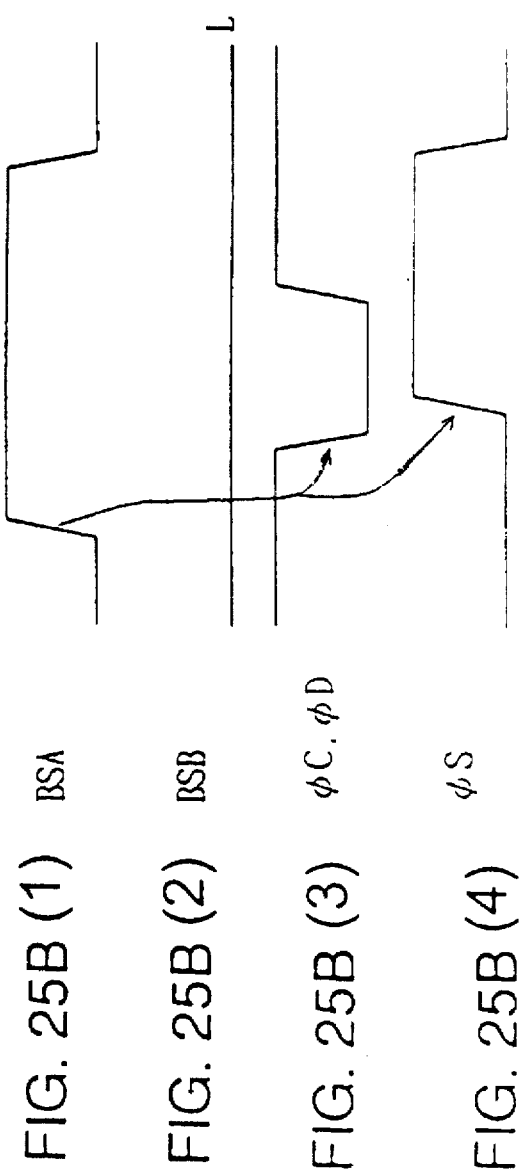
FIG. 25B (1) BSA
FIG. 25B (2) BSB
FIG. 25B (3) φC, φD
FIG. 25B (4) φS

TO WAY DECODER

HIERARCHICAL BIT LINE ARRANGEMENT IN A SEMICONDUCTOR MEMORY

This application is a continuation of application Ser. No. 08/288,776 filed Aug. 11, 1994 abandoned.

BACKGROUND OF THE INVENTION

1. Field of the Invention

The present invention relates to a semiconductor memory device, and in particular, to a semiconductor memory device including a hierarchical bit line arrangement which includes sub-bit lines connected to memory cells and main bit lines transmitting signal potentials on the sub-bit lines to sense amplifiers.

2. Description of the Related Art

FIG. 29 schematically shows a structure of a memory cell array part of a dynamic semiconductor memory device (which will be referred to merely as a DRAM, hereinafter) in the prior art. In FIG. 29, there are provided main bit line pairs (MBL and ZMBL) each for memory cells arranged in one row. FIG. 29 shows only two pairs of main bit lines MBL1, ZMBL1 and MBL2, ZMBL2. For the main bit line pair MBL1 and ZMBL1, there are provided a sense amplifier SA1 which differentially amplifies signal potentials on main bit lines MBL1 and ZMBL1, and a sense amplifier SA2 is likewise provided for main bit line pair MBL2 and ZMBL2. Here, a main bit line MBL and a main bit line ZMBL transfer signals complementary in logic to each other.

The memory cells arranged in one row are divided into a plurality of groups. Sub-bit line pair SBL and ZSBL are provided for each memory cell group. In the example shown in FIG. 29, memory cells MC in one row are divided into m groups each including n memory cells MC.

There are provided word lines WL11–WLmn crossing main bit lines MBL and ZMBL (MBL and ZMBL representatively designate main bit lines MBL1, ZMBL1, MBL2 and ZMBL2). Memory cells MC are disposed at crossings between word lines WL (WL generally designates word lines WL11–WLmn) and sub-bit line pairs SBL and ZSBL so that the sub-bit line pairs may form a folded bit line arrangement in which bit lines transferring data signals complementary to each other are placed in parallel on one side of a sense amplifier. For example, in connection with sub-bit line pair SBL1 and ZSBL1, memory cell MC is disposed correspondingly to the crossing between word line WL11 and sub-bit line SBL1, and a memory cell is not disposed at the crossing between word line WL11 and sub-bit line ZSBL1.

Block select switches T11, T12-Tm1, Tm2, which become conductive in response to block select signals BS1–BSm, are provided for connecting sub-bit line pairs SBL1, ZSBLa–SBLm, ZSBLm to main bit lines MBL1 and ZMBL1. Only sub-bit line pair SBL and ZSBL in the block containing the selected word line are connected to main bit lines MBL and ZMBL. Then, an operation will be briefly described below.

Sub-bit lines SBL and ZSBL as well as main bit line pair MBL and ZMBL are precharged to an intermediate potential of Vcc/2 (i.e., half of operation supply potential Vcc) in the standby state.

Upon application of an external address, a row select operation is first carried out. In parallel with the row select operation, a block select operation is carried out. Prior to rise of the potential of word line corresponding to the selected row, sub-bit lines which are connected to memory cells connected to the selected word line are connected to main bit lines MBL and ZMBL by select switches Ti1 and Ti2 (i=1, 2, ..., m).

Then, the potential of selected word line rises, and information stored in the memory cells connected to the selected word line is transmitted to the main bit lines via the corresponding sub-bit lines and block select switches. It is now assumed that word line WL11 is selected. In this case, data stored in memory cell MC is read onto sub-bit line SBL1, and is transmitted onto the main bit line MBL1 via block select switch T11. Since sub-bit line ZSBL1 is not connected to the selected memory cell, it maintains the precharged potential, and thus main bit line ZMBL1 maintains the intermediate potential. The same is true with respect to main bit line pair MBL2 and ZMBL2.

Other block select switches T21, T22–Tm1, Tm2 maintain an off state because block select signals BS2–BSm are in a low level and hence inactive state. Sub-bit line pairs SBL2, ZSBL2–SBLm, ZSBLm for these switches do not cross the selected word line, so that no memory cell is selected in connection with them, and thus sub-bit line pairs SBL2, ZSBL2–SBLm, ZSBLm maintain the precharged state.

After the potential of main bit line MBL1 changed in accordance with the stored information of selected memory cell MC, sense amplifiers SA (SA1 and SA2) are activated, and potential differences between main bit lines MBL1 and ZMBL1 and between MBL2 and ZMBL2 are sensed and amplified.

In this state, read or write of data is carried out by not shown unit or circuitry.

Upon completion of the write or read of data, the potential of selected word line lowers, and then, block select switches T11 and T12 are turned off, and sense amplifiers SA are deactivated.

The above structure, in which main bit lines and sub-bit lines are in the hierarchical arrangements and the memory cells are connected only to the sub-bit lines, can achieved the following advantage. The memory cells connected to each sub-bit line are small in number, and also the length of each sub-bit line can be short. Therefore, by providing the main bit lines made of metal interconnections of a low resistance, a total parasitic capacitance and a total interconnection capacitance of the sub-bit lines and main bit lines can be reduced. Data can be read from memory cells without delay in signal propagation due to an interconnection resistance, and the read data can be transmitted to sense amplifiers at a high speed, so that the access time can be reduced.

Owing to a small bit line capacitance Cb, a read voltage which is proportional to a rate Cs/Cb between a memory cell capacitance Cs and a bit line capacitance Cb can be sufficiently large even if the memory cell capacitance Cs is small due to high integration, so that a correct sensing operation is ensured.

The hierarchical bit line arrangement described above is currently employed in some of DRAMs of a large capacity such as 256 M-bits, and will be employed in more DRAMs.

DRAMs of a large storage capacity can be achieved by high-density and high-integration technology. This reduces a size of memory cell as well as a pitch of bit lines.

Sub-bit lines and main bit lines are formed of different interconnection layers as shown in FIG. 30. In FIG. 30, sub-bit lines 101 are formed of a first level interconnection layer, and main bit lines 102 are formed of a second level interconnection layer. A pitch SP, i.e., a distance between the center lines of adjacent sub-bit lines, of sub-bit lines 101 is substantially equal to a pitch MP of main bit lines 102. Therefore, it is difficult to ensure a large area of a contact region for connecting the sub-bit line to the main bit line via the block select switch (because the contact region requires a width larger than an interconnection line width). Thus, layout of block select switches are severely restricted.

Further, reduction of bit line pitches SP and MP increases inter-bit-line capacitances. In FIG. 30, there are shown capacitances C1 between sub-bit lines, capacitances C2 between main bit lines and capacitances C0 between sub-bit lines 101 and main bit lines 102. FIG. 31 shows an electrically equivalent circuit of these capacitances between bit lines. If the pitches SP and MP between bit lines are reduced, the capacities C1 and C2 between the bit lines increase. As a result, a total capacitance of bit lines increases, which causes delay in signal propagation, reduction of a read voltage amplitude and increase of a sense amplifier load, so that advantage of the hierarchical bit line arrangement is impaired.

FIG. 32 shows a structure of a sense amplifier portion shown in FIG. 29. In FIG. 32, each of sense amplifiers SA (SA1 and SA2) includes n-channel MOS transistor (N1 and N2, or N3 and N4) having cross-coupled gates and drains, and p-channel MOS transistors (P1 and P2, or P3 and P4) having cross coupled gates and drains. The sense amplifier portion formed of the n-channel MOS transistors is driven by a sense amplifier drive signal φSN to discharge a lower potential of a main bit line between the potentials of the corresponding main bit line pair to the ground potential level. The sense amplifier portion formed of the p-channel MOS transistors is driven by a sense amplifier drive signal φSP to discharge a higher potential of a main bit line between the potentials of the corresponding main bit line pair to the operation supply potential level.

Adjacent to sense amplifiers SA (SA1 and SA2), there are provided internal data lines IO1, IO2, ZIO1 and ZIO2 for transmitting internal data which cross main bit line pairs MBL1, ZMBL1, MBL2 and ZMBL2. Internal data lines IO1 and ZIO1 transmit internal data which are complementary to each other. Internal data lines IO2 and ZIO2 transmit internal data which are complementary to each other.

There are provided I/O gates IG1 and IG2 for connecting main bit lines MBL1 and ZMBL1 and main bit lines MBL2 and ZMBL2 to internal data lines IO1 and ZIO1 and internal data lines IO2 and ZIO2, respectively.

I/O gate IG1 includes n-channel MOS transistors N5 and N6 which become conductive in response to a signal potential on a column select line CSL to connect main bit lines MBL1 and ZMBL1 to internal data lines IO1 and ZIO1, respectively. I/O gate IG2 includes n-channel MOS transistors N7 and N8 which become conductive in response to the signal potential on column select line CSL to connect main bit lines MBL2 and ZMBL2 to internal data lines IO2 and ZIO2, respectively.

Column select line CSL transmits a column select signal to and from a column decoder. One column select line CSL selects memory cells of 2-bits. If the DRAM has a x1-bit structure, one pair of complementary internal data lines are selected from these internal data lines IO1, ZIO1, IO2 and ZIO2 by a way decoder.

As described above, it is necessary to provide sense amplifier SA for each main bit line pair. The possible maximum pitch of sense amplifiers SA may be twice as large as pitch MP of main bit lines. Therefore, in accordance with reduction of the pitch of main bit lines, an area required for each of sense amplifiers may excessively decrease to an extent which would not allow many transistors of the sense amplifiers to be provided in the reduced area.

Column select line CSL is provided in parallel to the main bit lines MBL and ZMBL. If the column select line is formed of an interconnection layer of the same level as the main bit line, the pitch condition imposed on the sense amplifiers becomes more severe because an area for the column select line has to be provided between sense amplifiers. In order to relax the pitch conditions on the sense amplifiers and the main bit lines, it would be contemplated that a column select line and a main bit line are formed of interconnection lines of different levels from each other, resulting in increase of the number of manufacturing steps.

Sense amplifier SA differentially amplifies the potential of the bit line connected to the selected memory cell, using the potential of the reference bit line, i.e., the other bit line not connected to the selected memory cell. In order to ensure an accurate sensing operation, the potential of this reference bit line must be correctly maintained at an intermediate potential. For this purpose, it is known to use a dummy cell provided with a capacitor having a capacitance which is generally a half of that of a memory cell. FIG. 33 shows a form of arrangement of the dummy cell. In FIG. 33, the memory cells are divided into blocks #1, #2, . . . , and each block is provided with sub-bit line pairs SBL1 and ZSBL2, and SBL2 and ZSBL2.

In the following description, it is assumed that word line WL in block #1 is selected and data of selected memory cell is read onto sub-bit line SBL1 as shown in FIG. 33. In this case, sub-bit line ZSBL1 forms the reference bit line, and a dummy word line DWL is set to the selected state for selecting the dummy cell connected to sub-bit line ZSBL1. Thereby, an intermediate potential is maintained at sub-bit line ZSBL1, which is the reference bit line with respect to sub-bit line SBL1. Such a structure cannot be utilized that the dummy cell is directly connected to main bit lines MBL and ZMBL, because the main bit lines are formed of the interconnection layer located at a higher position, and must receive the reference potential for the selected sub-bit line.

In the hierarchical bit line arrangement, only the sub-bit line pair in the selected block containing the selected word line is connected to the main bit line pair. Therefore, it is necessary to provide the dummy cell and dummy word line for each sub-bit line pair.

More specifically, as shown in FIG. 34, two dummy cells and hence two dummy word lines DWL1 and DWL2 must be provided for one sub-bit line pair SBL and ZSBL, because such two cases are required that the dummy cell is connected to sub-bit line SBL and that the dummy cell is connected to sub-bit line ZSBL. By this reason, a large number of dummy word lines are required, and an area utilization efficiency of the memory cell array is low.

SUMMARY OF THE INVENTION

An object of the invention is to provide a hierarchical bit line arrangement which can remarkably increase a pitch of main bit lines.

Another object of the invention is to provide a highly integrated semiconductor memory device of a high density structure having an improved read margin and a reduced bit line capacitance.

Still another object of the invention is to provide a semiconductor memory device having an improved area utilization efficiency.

Briefly, a semiconductor memory device according to the invention includes sub-bit lines in an open bit line arrangement while employing main bit lines in an open bit line arrangement and maintaining a memory cell structure suitable to a folded bit line arrangement.

A semiconductor memory device of a preferred embodiment includes sense amplifiers each of which has a first node disposed at its one side and a second node disposed at the other side for sensing and amplifying a potential difference between the first and second nodes, a first main bit line disposed at the one side of each sense amplifier and coupled to the first node, and a second main bit line disposed at the other side of each sense amplifier and coupled to the second node. The second main bit line extends oppositely to an extending direction of the first main bit line.

The semiconductor memory device also includes a plurality of word lines each crossing the first or second main bit line, a plurality of first sub-bit line pairs each including first and second sub-bit lines parallel to the first main bit line, a plurality of second sub-bit line pairs each including third and fourth sub-bit lines parallel to the second main bit line, and a plurality of memory cells provided correspondingly to crossings of each of the word lines and the first or second sub-bit line pairs. Each of the memory cells is disposed such that one word line selects one memory cell related one sub-bit line pair.

The semiconductor memory device further includes a plurality of switches each of which is provided correspondingly to each of the first and second sub-bit line pairs for connecting the sub-bit line pair, which is connected to the memory cell connected to the selected word line, to the corresponding main bit line.

Since the main bit lines and the sub-bit lines are substantially in the open bit line arrangements, high-density arrangement of the memory cells is allowed. Since the memory cells are arranged in a form similar to the folded bit line arrangement, one main bit line is provided for each sub-bit line. The pitch of the main bit lines can be twice as large as the pitch of the sub-bit lines, and thus restrictions on the pitch of main bit lines can be eased remarkably without impairing the degree of integration of memory cells.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10(a) to 10(e) are signal waveform diagrams for showing an operation of a circuitry shown in FIG. 9;

FIGS. 25A and 25B schematically show a major structure of a DRAM of a fifth embodiment of the invention and an operation of sense amplifiers of a latch type;

DESCRIPTION OF THE PREFERRED EMBODIMENT

Figure 1:
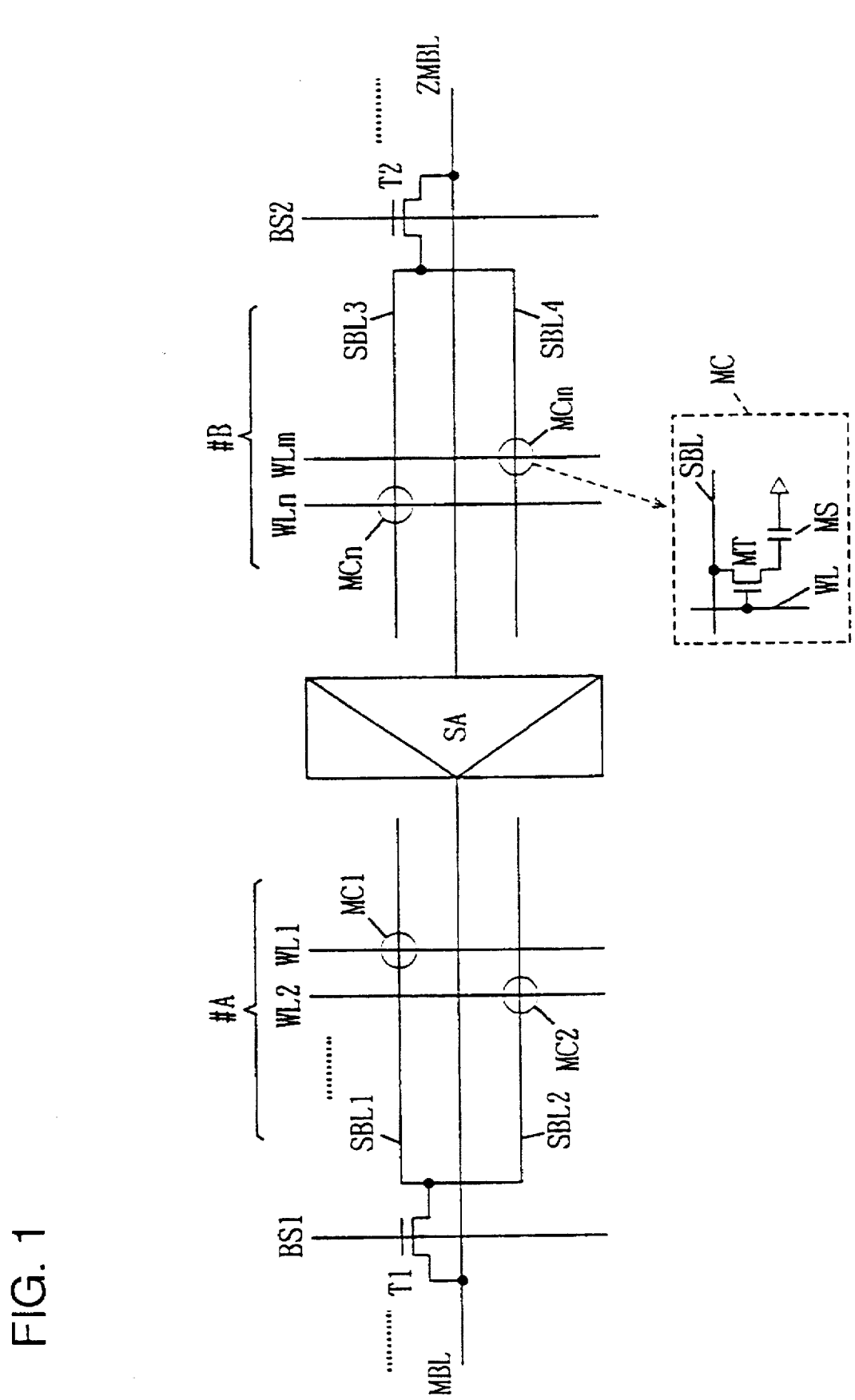
FIG. 1 schematically shows a major structure of a DRAM of a first embodiment of the invention.

FIG. 1 shows a major structure of a semiconductor memory device of an embodiment of the invention. In FIG. 1, memory cells are divided into a plurality of groups disposed along a bit line direction. In FIG. 1, only two memory cell groups #A and #B are shown. Sub-bit line pairs are provided for respective memory cell groups.

Sub-bit lines SBL1 and SBL2 are provided for memory cells in memory cell group #A. Sub-bit lines SBL3 and SBL4 are provided for memory cells in memory cell group #B. Sub-bit lines SBL1 and SBL2 are connected together. Likewise, sub-bit lines SBL3 and SBL4 are formed of the same interconnection layer and are connected together.

A plurality of word lines WL (WL1, WL2, . . .) are disposed across sub-bit lines SBL1 and SBL2. A plurality of word lines WL (WLn, WLm, . . .) are disposed across sub-bit lines SBL3 and SBL4.

Memory cells MC are disposed to allow such an operation that one word line selects one of memory cell in connection with one sub-bit line pair. For example, a memory cell MC1 is disposed correspondingly to the crossing between word line WL1 and sub-bit line SBL1, and a memory cell MC2 is disposed correspondingly to the crossing between word line WL2 and sub-bit line SBL2.

In memory cell group #B, a memory cell MCn is disposed correspondingly to the crossing between word line WLn and sub-bit line SBL3 and a memory cell MCm is disposed correspondingly to the crossing between word line WLm and sub-bit line SBL4.

As can be seen within a block represented by broken line, memory cell MC includes one memory cell capacitor MS and a memory cell transistor MT which is responsive to a signal potential of corresponding word line WL to connect memory cell capacitor MS to corresponding sub-bit line SBL.

Only one main bit line is provided for each pair of sub-bit lines. For example, main bit line MBL is provided for sub-bit lines SBL1 and SBL2, and main bit line ZMBL is provided for sub-bit lines SBL3 and SBL4.

Sense amplifier SA is disposed between main bit lines MBL and ZMBL. Sense amplifier SA has first and second nodes which are connected to main bit lines MBL and ZMBL, respectively. Sense amplifier SA senses and amplifies the potential difference between main bit lines MBL and ZMBL.

The sub-bit line pair is connected to the main bit line pair by a block select switch which is responsive to a block select signal BS to connect the corresponding sub-bit line pair to the main bit line pair. In FIG. 1, block select switch T1 is provided for sub-bit lines SBL1 and SBL2. Block select switch T1 becomes conductive in response to block select signal BS1 to connect these sub-bit lines SBL1 and SBL2 to main bit line MBL. For sub-bit lines SBL3 and SBL4, there is provided a block select switch T2 which becomes conductive in response to a block select signal BS2 to connect sub-bit lines SBL3 and SBL4 to main bit line ZMBL.

Block select signals BS1 and BS2 are generated in such a manner that only the sub-bit lines crossing the selected word line are connected to the corresponding main bit line. Since the word lines are divided into groups in accordance with the groups of memory cells, the block select signal can be generated using a predetermined bit(s) of the row address signal. Then, an operation will be briefly described below.

It is assumed that an applied address signal designates word line WL1. Block select signal BS1 rises to a high level, and block select switch T1 becomes conductive to connect sub-bit lines SBL1 and SBL2 to main bit line MBL. Block select signal BS2 is in a low level, and the block select switch T2 maintains an off state. During a standby state, main bit lines MBL and ZMBL is precharged to a predetermined voltage level by a precharging circuitry (not shown). Upon start of a memory cycle, main bit lines MBL and ZMBL are set to a floating state.

When the potential of word line WL1 rises, data stored in memory cell MC1 is transmitted to main bit line MBL via sub-bit line SBL1. Then, sense amplifier SA is activated to amplify differentially the potentials of main bit lines MBL and ZMBL. More specifically, main bit line ZMBL functions as a reference bit line, and sense amplifier SA differentially amplifies the potential of main bit line MBL using the potential (precharged potential) of this reference bit line as the reference potential.

In the arrangement shown in FIG. 1, main bit lines MBL and ZMBL are disposed at opposite sides of the sense amplifier SA. Thus, the main bit lines are in an open bit line arrangement. Sub-bit lines SBL1 and SBL2 are formed of the same interconnection layer and thus are mutually connected. One memory cell is selected in connection with these sub-bit lines SBL1 and SBL2. Therefore, the sub-bit lines forms an open bit line arrangement. The same is true with respect to sub-bit lines SBL3 and SBL4.

Only one main bit line is provided from one pair of sub-bit lines. Therefore, the pitch of main bit lines MBL and ZMBL is twice as large as the pitch of sub-bit lines SBL, so that restrictions on the pitch of main bit lines and hence layout can be eased remarkably.

Since restrictions on the pitch of main bit lines is eased, a distance between the main bit lines can be large, so that a capacitance between main bit lines and hence a total bit line capacitance can be reduced.

As restrictions on the pitch of main bit lines is eased, restrictions on the pitch of sense amplifiers are also eased, allowing easy layout of the sense amplifiers.

Since one of the paired bit lines (e.g., SBL1 and SBL2) is connected to the main bit line via one switching element, restrictions on the pitch of switching elements are eased, allowing easy layout of the switching elements.

Figure 2:
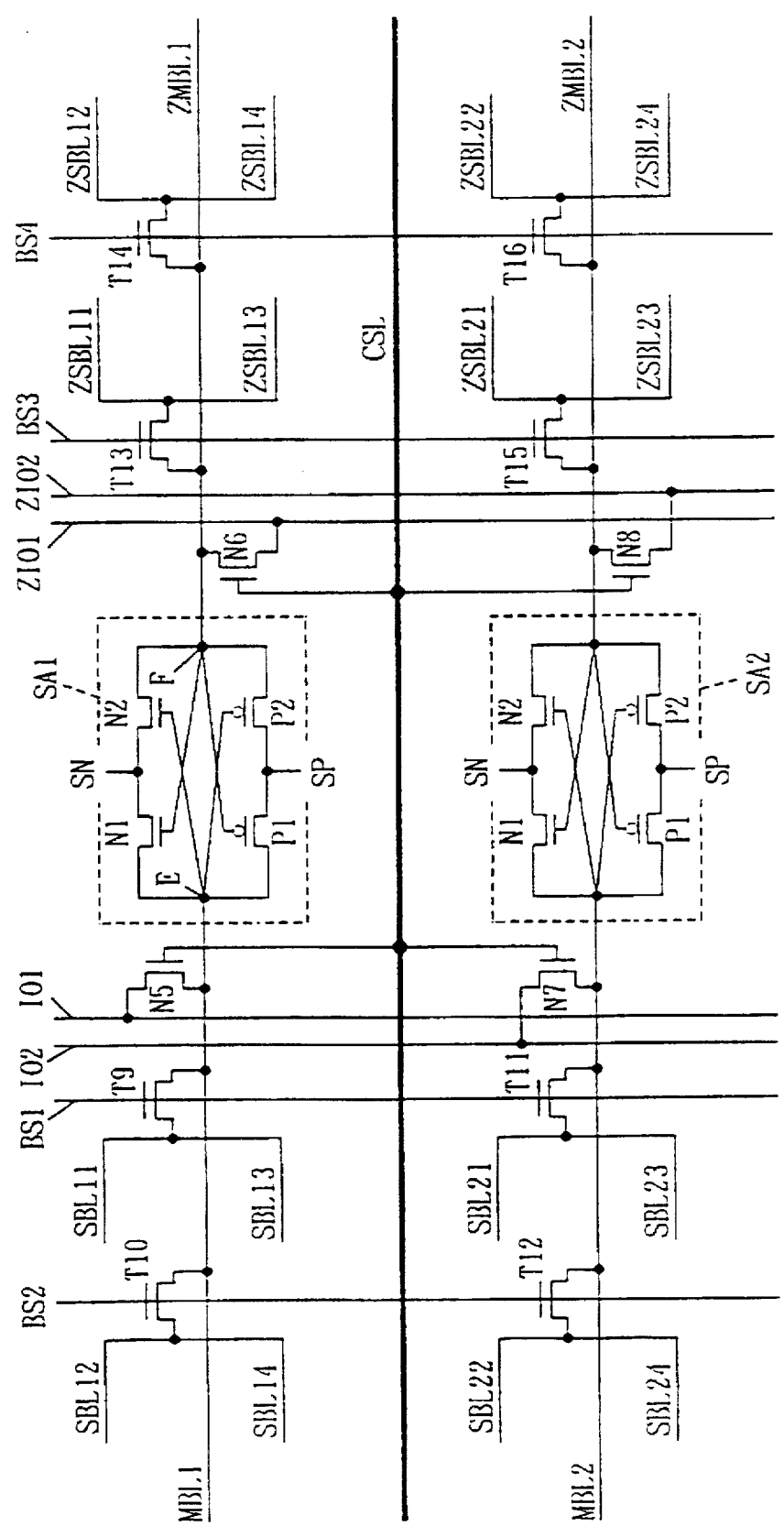
FIG. 2 shows a specific structure of a sense amplifier portion shown in FIG. 1.

FIG. 2 shows a specific structure of and near the sense amplifiers shown in FIG. 1. FIG. 2 shows the structure relating to memory cells in two rows.

In FIG. 2, sense amplifier SA1 is disposed between main bit lines MBL1 and ZMBL1, and sense amplifier SA2 is disposed between main bit lines MBL2 and ZMBL2. Sense amplifier SA1 has a first node E connected to main bit line MBL1 and a second node F connected to a main bit line ZMBL1.

Sub-bit lines SBL11–SBL14 are provided for and in parallel to main bit line MBL1. Sub-bit lines ZSBL11–ZSBL14 are provided for and in parallel to main bit line ZMBL1. Sub-bit lines SBL11 and SBL13 and sub-bit lines SBL12 and SBL14 are connected to main bit line MBL1 via block select switches T9 and T10 which become conductive in response to block select signals BS1 and BS2, respectively. Sub-bit lines ZSBL11 and ZSBL13 and sub-bit lines ZSBL12 and ZSBL14 are connected to main bit line ZMBL1 via block select switches T13 and T14 which become conductive in response to block select signals BS3 and BS4, respectively.

Similarly, sub-bit lines SBL21–SBL24 are provided for main bit line MBL2. Sub-bit lines ZSBL21–ZSBL24 are provided for main bit line ZMBL2. Sub-bit lines SBL21 and SBL23 and sub-bit lines SBL22 and SBL24 are connected to main bit line MBL2 via block select switches T11 and T12, respectively. Sub-bit lines ZSBL21 and ZSBL23 and sub-bit lines ZSBL22 and ZSBL24 are connected to main bit line ZMBL2 via block select switches T15 and T16, respectively.

Block select switches T11 and T12 become conductive in response to block select signals BS1 and BS2, respectively. Block select switches T15 and T16 become conductive in response to block select signals BS3 and BS4, respectively.

Each of sense amplifiers SA1 and SA2 includes n-channel MOS transistors N1 and N2 having cross-coupled gates and drains as well as p-channel MOS transistors P1 and P2 having cross-coupled gates and drains. Each of sense amplifiers SA1 and SA2 differentially amplifies potentials of nodes E and F.

Column select line CSL is disposed between main bit lines MBL1 and ZMBL1 and between main bit lines MBL2 and ZMBL2. A column select signal is transmitted onto column select line CSL from a column decoder.

Parallel to block select signal lines BS, there are disposed internal data lines IO1, IO2, ZIO1 and ZIO2 adjacent to sense amplifiers SA1 and SA2. There are provided I/O gates N5, N7, N6 and M8 for connecting main bit lines MBL1, MBL2, ZMBL1 and ZMBL2 to internal data lines IO1, IO2, ZIO1 and ZIO2 in response to a signal potential on the column select line CSL. The signal on column select line CSL attains a high level after completion of sensing operations of sense amplifiers SA1 and SA2.

As can be seen from FIG. 2, the pitch of main bit lines MBL and ZMBL can be sufficiently large, so that the I/O gate transistors and sense amplifiers can be arranged with a sufficient margin of area. Further, column select line CSL can be formed parallel to main bit lines MBL1 and ZMBL in the same interconnection layer with a sufficient margin. In addition, the same layout pattern of memory cells is repeated along a column direction to facilitate a layout pattern design, and memory cells are arranged efficiently.

[Second Embodiment]

Figure 3:
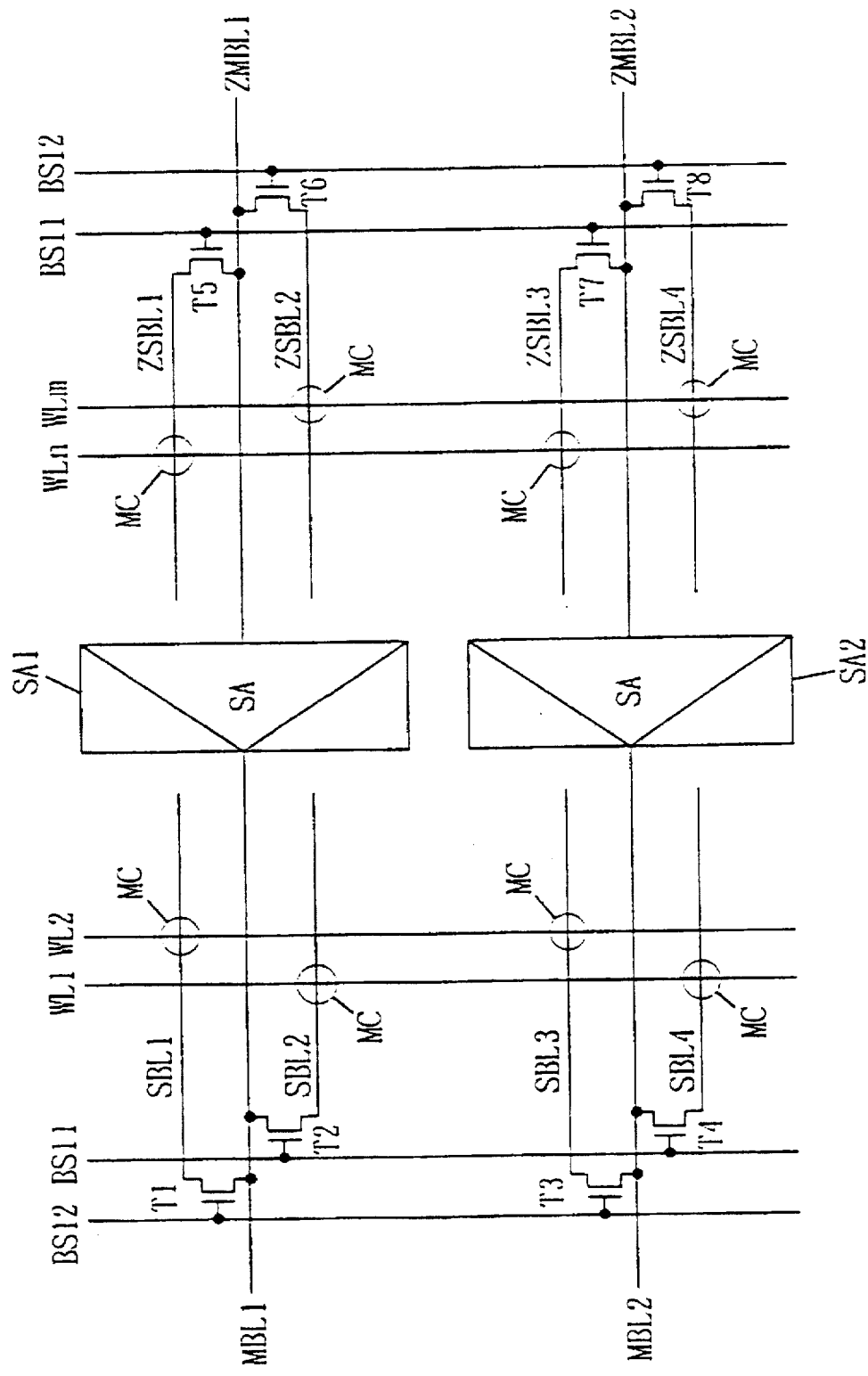
FIG. 3 schematically shows a major structure of a DRAM of a second embodiment of the invention.

FIG. 3 shows a major structure of a DRAM of a second embodiment of the invention. The structure in FIG. 3 is provided with block select switches T (T1–T8) for sub-bit lines SBL (SBL1–SBL4) and ZSBL (ZSBL1–ZSBL4), respectively. When one of block select switches T1–T8 becomes conductive, the others become nonconductive. Specific structures other the above are the same as those shown in FIG. 1. According to the structure shown in FIG. 3, only one sub-bit line SBL and only one sub-bit line ZSBL are connected to main bit lines MBL and ZMBL, respectively. The other sub-bit lines paired with the above sub-bit lines are isolated from the corresponding main bit lines. Therefore, the total bit line capacitance is further reduced, so that delay in propagation of signals through bit lines is suppressed, which reduces an access time. Also, a read voltage and hence a sense margin can be increased.

[Third Embodiment]

Figure 4:
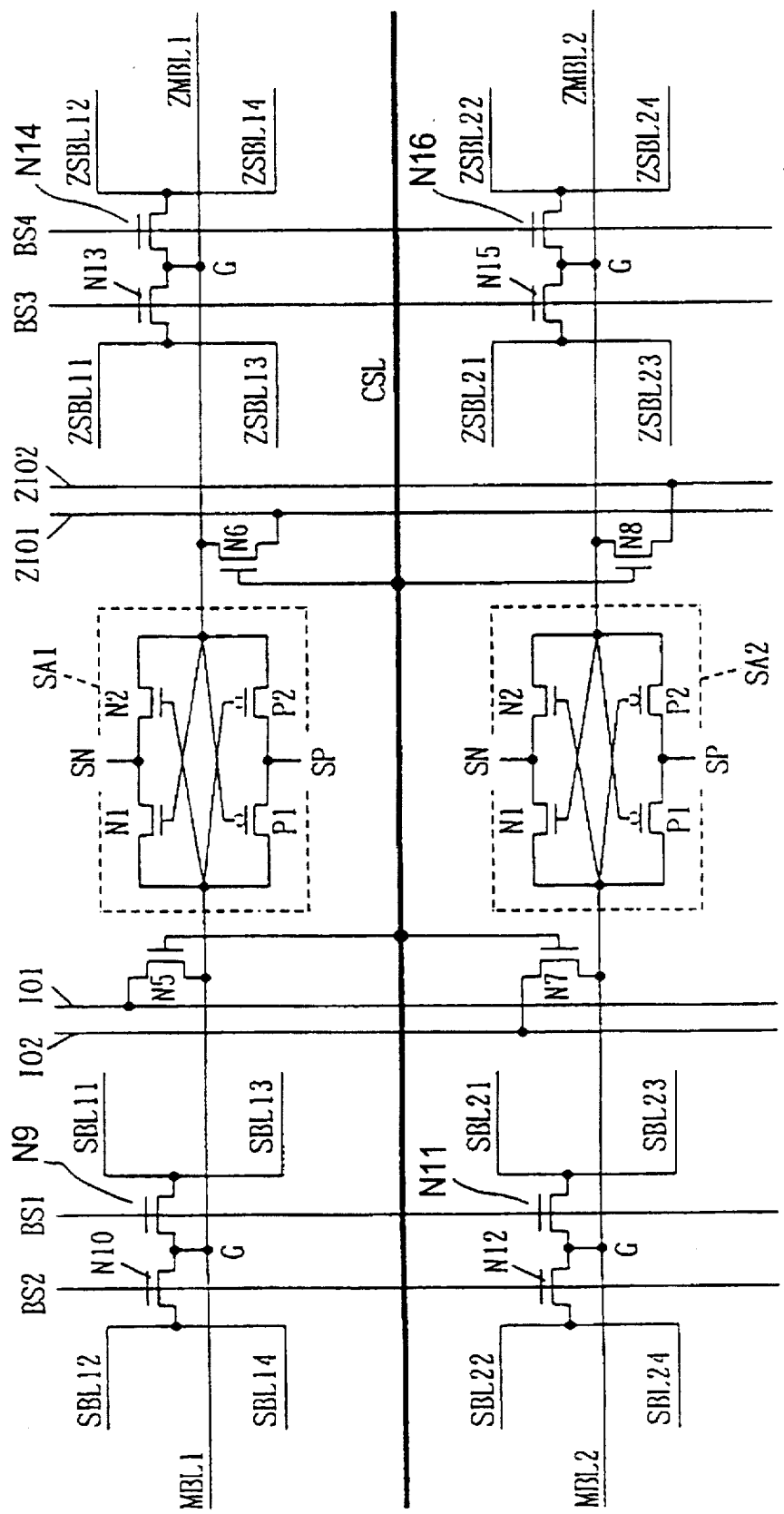
FIG. 4 shows a major structure of a DRAM of a third embodiment of the invention.

FIG. 4 shows a main structure of a DRAM of a third embodiment of the invention. In the structure shown in FIG. 4, block select switches, which relate to the same main bit line and are provided for adjacent sub-bit line pair, are adjacent to each other. More specifically, paired sub-bit lines are connected together at a position near the adjacent sub-bit line pair. In the structure shown in FIG. 4, block select switches (e.g., N9 and N10) are adjacent to each other, so that they are connected to main bit line (e.g., MBL1) through the same region (i.e., portion G), whereby an area required for them can be reduced. Thus, the adjacent block select switches can commonly use a diffusion layer, so that a layout area of the block select switches can be reduced. Other specific structures are the same as those shown in FIG. 2, and the corresponding portions bear the same reference characters. However, the block select switches are designated by reference characters N9–N15, because they commonly use regions (or diffusion regions) for connection to the main bit lines.

Figure 5:
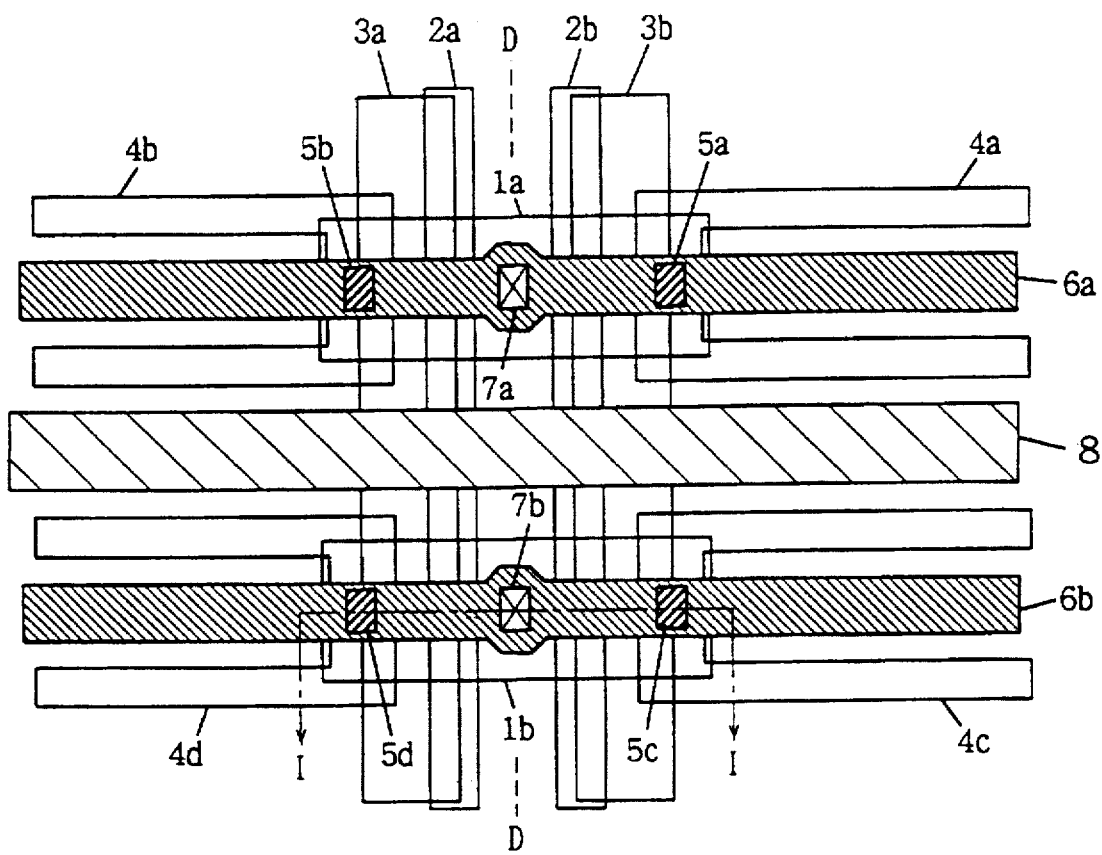
FIG. 5 shows a plan layout of block select switches shown in FIG. 4.

FIG. 5 shows a plan layout of the block select switches shown in FIG. 4, and more specifically, shows a portion relating to one main bit line.

In FIG. 5, MOS transistors forming the block select switches are formed in field regions 1a and 1b. Parallel to a center line D in FIG. 5, there are disposed first level polysilicon layers 2a and 2b, which contact first level aluminum interconnection layers 3a and 3b at a high position via predetermined regions (not shown in FIG. 5). First polysilicon layers 2a and 3a form gates of the block select switches, and first level aluminum interconnection layers 3a and 3b form block select signal transmission lines.

Substantially U-shaped second polysilicon layers 4a and 4b are disposed symmetrically to each other with respect to center line D. Second polysilicon layers 4c and 4d are disposed in a similar fashion. These second polysilicon layers 4a, 4b, 4c and 4d form the sub-bit lines. Second polysilicon layers 4a, 4b, 4c and 4d are connected to impurity regions formed in the field regions 1a and 1b at the lower position via contact holes 5a, 5b, 5c and 5d, respectively.

Parallel to the second polysilicon layers 4a and 4b and second polysilicon layers 4c and 4d, there are disposed low resistance layers 6a and 6b made of, e.g., tungsten, respectively. The low resistance layers 6a and 6b form the main bit lines. Low resistance layers 6a and 6b are connected to impurity regions formed in field regions 1a and 1b at the lower position via contact holes 7a and 7b, respectively.

A second aluminum layer 8 parallel to low resistance layers 6a and 6b is formed between them. Second aluminum layer 8 forms the column select line. Since the pitch of low resistance layers 6a and 6b forming the main bit lines is large, second aluminum layer 8 forming the column select line can be disposed leaving a sufficient margin.

As shown in FIG. 5, the block select switches can be arranged symmetrically to each other with respect to center line D, which facilitates layout. Further, the block select switches can be formed leaving a sufficient margin.

Figure 6:
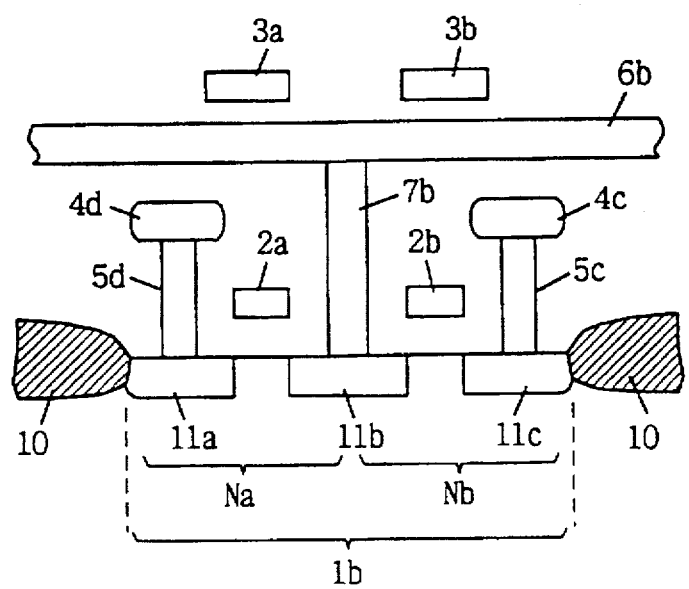
FIG. 6 shows a sectional structure taken along line I—I in FIG. 5.

FIG. 6 is a cross section taken along line I—I in FIG. 5. In FIG. 6, a boundary of field region 1b is defined by a filed insulating film 10 formed of, e.g., an LOCOS film. At a surface of a substrate in field region 1b, there are formed impurity layers 11a, 11b and 11c with a space between each other. First polysilicon layer 2a is formed on a channel region located between impurity regions 11a and 11b with a gate insulating film therebetween. First polysilicon layer 2b is formed on a channel region located between impurity regions 11b and 11c with the gate insulating film therebetween. Impurity regions 11a and 11b and first level polysilicon layer 2a form one block select switch Na, and impurity regions 11c and 11b and first level polysilicon layer 2b form the other block select switch 2b.

Impurity region 11a is electrically connected to a second polysilicon layer 4d forming the sub-bit line via a contact hole 5d. Impurity region 11c is electrically connected to a second polysilicon layer 4c forming the sub-bit line via a contact hole 5c. Impurity region 11b is electrically connected to low resistance layer 6b made of tungsten layer and forming the main bit line via a contact hole 7b. On the low resistance layer 6b are formed first level aluminum layers 3a and 3b in parallel to first level polysilicon layers 2a and 2b. First aluminum interconnection layer 3a and first level polysilicon layer 2a are electrically connected together through a predetermined region, which substantially reduces a resistance of the block select signal transmission line.

Figure 7:
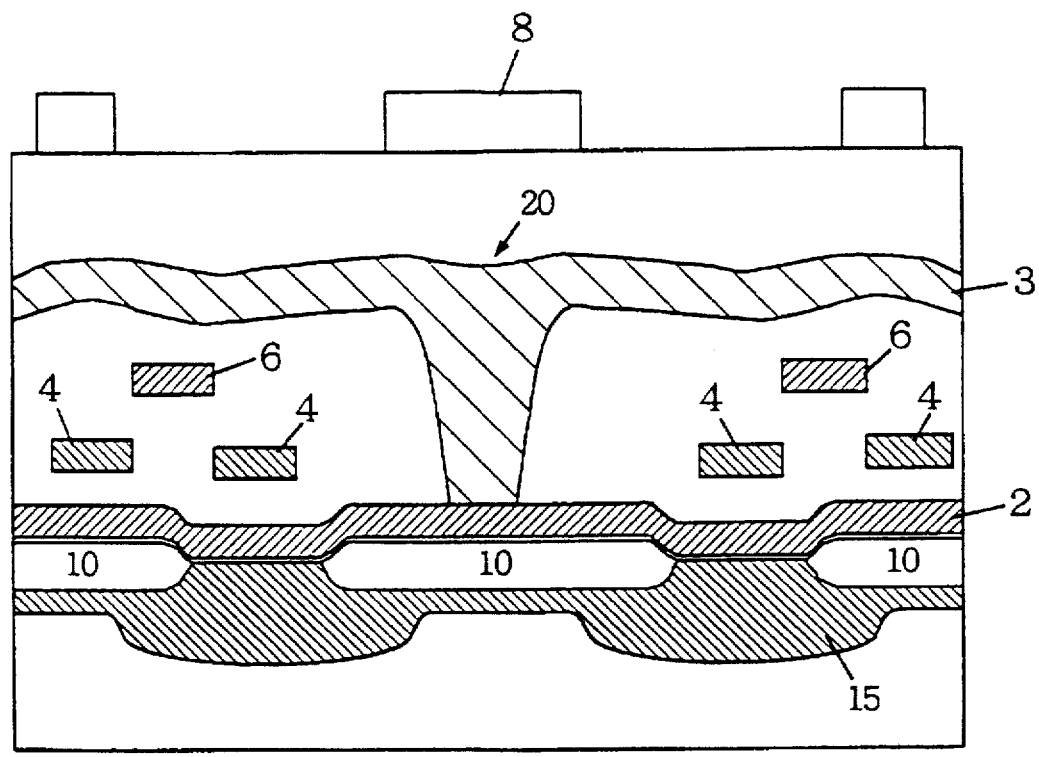
FIG. 7 shows a shunt structure of a block select signal transmission line.

FIG. 7 shows a form of connection between the first level aluminum layer and the first level polysilicon layer. In FIG. 7, a P-type well 15 is formed at a surface of the semiconductor memory device. Transistor elements are formed in P-type well 15. A transistor element forming region, i.e., field region is surrounded and defined by field insulating film 10. A first level polysilicon layer 2 is formed to achieve gates of transistors. A first level aluminum layer 3 is formed parallel to first level polysilicon layer 2. Second level polysilicon layers 4 and tungsten layers (low resistance layers) 6 are formed between first level aluminum layer 3 and first level polysilicon layer 2. First level aluminum layer 3 and first level polysilicon layer 2 are mutually connected on field insulating film 10. The region at which first level polysilicon layer 2 and first level aluminum layer 3 are connected is called a shunt region. Second level aluminum layer 8 is formed on first level aluminum layer 3.

Figure 8:
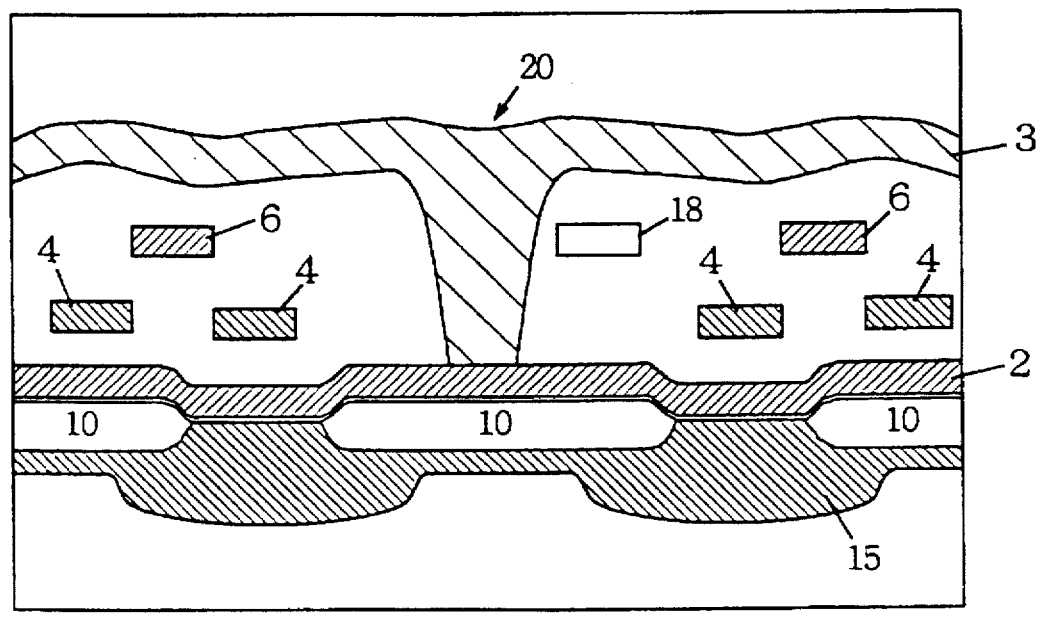
FIG. 8 shows another example of a shunt structure of a block select signal transmission line.

Second level aluminum layer 8 forming the column select line can be formed leaving a sufficient margin, because the pitch of tungsten layers 6 forming the main bit lines is large. In this case, the column select line may be formed of a low resistance layer 18 of tungsten located at the same level as low resistance layer 6 forming the main bit line, as shown in FIG. 8. The structure shown in FIG. 7 requires three-layer metal process for forming the first level aluminum layer, second level aluminum layer and tungsten layer. The structure shown in FIG. 8, however, requires only two-layer metal process for forming the first level aluminum layer and tungsten layer. Therefore, the memory cell array part can be formed without increasing the number of manufacturing steps.

In FIG. 8, low resistance layer 18 forming the column select line is formed near shunt region 20. Shunt regions such as word line shunt regions are generally formed in regions which do not contain a memory cell and are located between memory cell blocks. Similarly, the shunt region of block select signal line may be located correspondingly to the word line shunt region, in which case shunt region 20 does not exist near the column select line (which is formed at the region containing the memory cells), so that low resistance layer 18 forming the column select line can be formed leaving a more sufficient margin.

The block select signal line having the shunt structure has an advantage which will be described below.

Figure 9:
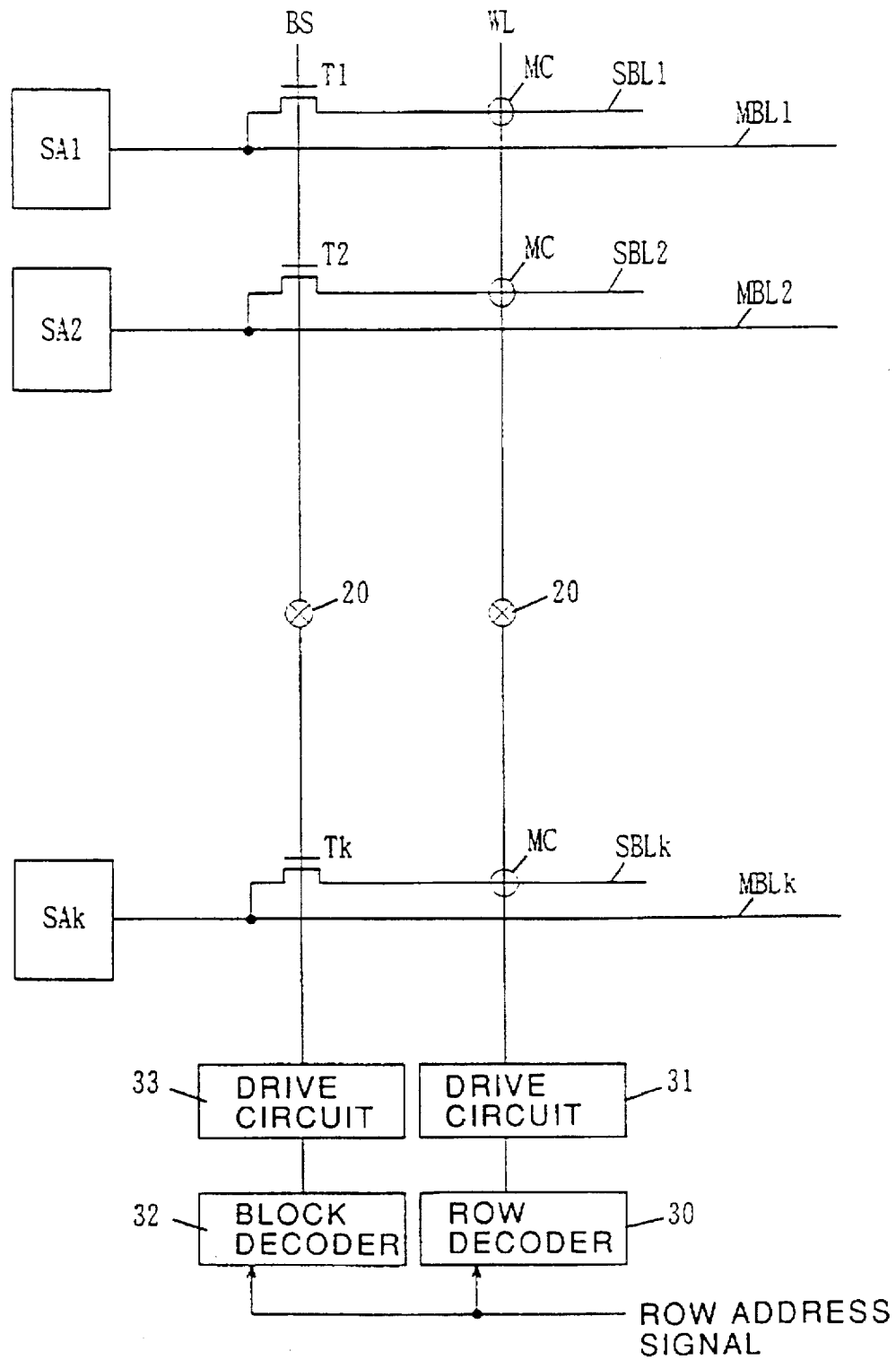
FIG. 9 is a diagram for showing an advantage of a shunt structure of a block select signal transmission line.

FIG. 9 shows a structure including the block select switches and the word line drive portion. In FIG. 9, a row decoder 30 decodes a received row address signal to generate a row select signal. A drive circuit 31 drives word line WL to a high level in accordance with the row select signal sent from row decoder 30. A block decoder 32 decodes a predetermined number of bits of the row address signal to generate the block select signal. A drive circuit 33 drives the block select signal line BS to a high level in accordance with the block select signal sent from block decoder 32 (signal lines and signals on the same are designated by the same reference characters). Block select signal BS turns on block select switches T1, T2, . . . , Tk provided correspondingly to main bit lines MBL1–MBLk. Word line WL sets memory cell transistors in memory cells MC to a conductive state, and transmits data of memory cells MC to sub-bit lines SBL1, SBL2, . . . , SBLk, respectively.

Word line WL is also formed of first level polysilicon layer 2 and first level aluminum interconnection layer 3, which are mutually connected at predetermined region 20 as shown in FIGS. 7 and 8. First level polysilicon layer 2 in word line WL forms gates of the memory cell transistors. Thereby, the word line can transmit the word line drive signal at a high speed from drive circuit 31 to a remote end thereof.

Word line WL and block select signal transmission line BS are parallel to each other. Block select signal transmission line BS and word line WL may have the similar shunt structures, in which case the degrees of propagation delay of block select signal and word line drive signal can be the same.

FIGS. 10(a) to 10(e) are diagrams for showing an advantage of the shunt structure of block select signal line. Referring to FIGS. 9 and 10, the advantage of the shunt structure of block select signal line will be described below.

Row decoder 30 and block decoder 32 decodes the row address signal and block address signal (i.e., a predetermined number of bits of the row address signal). Drive circuit 33 raises block select signal BS to a high level at a timing simultaneous with or preceding the raise of word line by drive circuit 31. If the block select signal line BS is made of only the first level polysilicon and has a high resistance, the block select signal BS rises slowly in the above operation. When word line WL is driven by drive circuit 31 to raise its potential to a high level, block select signal BS may not yet attain a high level, in which case block select switches T1–Tk are not yet in the complete on state, and sub-bit lines SBL1–SBLk are not yet connected to main bit lines MBL1–MBLk, respectively. For the accurate sensing operation, the potentials of main bit lines MBL1–MBLk must attain the potential level corresponding to data read from memory cells, and sense amplifiers SA1–SAk must be driven after the potential changes to a large extent or changes to attain the stable state. This delays the timing of activation of sense amplifier activation signals φSA (corresponding to SN and SP). In this case, the sense timing is delayed, resulting in increase of the access time.

In contrast to the above, if the block select signal line has the shunt structure, the block select signal BS is transmitted via the first level aluminum layer of a low resistance, and thereby the potential rises rapidly, so that block select switches T1–Tk become conductive at the substantially same time as the word line WL is selected. Therefore, memory cell data read onto sub-bit lines SBL1–SBLk can be immediately read onto main bit lines MBL1–MBLk. In this case, sense amplifier activation signals φSA can be activated in accordance with decision of potentials of main bit lines MBL1–MBLk, so that the sense timing can be advanced.

If the block select signal line has a large resistance, the block select signal BS will slowly changes its state from the selected state to the unselected state after word line WL attains the unselected state. In this case, an operation for selecting a new word line must start after block select signal BS surely attains a low level. Therefore, a so-called RAS precharge time of the DRAM is long, and the DRAM cannot operate at a high speed. While the state of word line is changing to the unselected state, the memory cells are in the unselected state, the sense amplifiers are in the inactivate state, and main bit lines and sub-bit lines SBL are precharged to the predetermined precharged potentials. In this case, data can be read from memory cells, even if block select signal BS is selected before another block select signal BS lowers completely to a low level. However, a plurality of sub-bit lines are connected to the main bit line, so that the total capacitance of the main bit line increases, causing insufficient read voltage and delay in signal propagation. Therefore, the accurate and high-speed sensing operation cannot be ensured.

Owing to the shunt structure of the block select signal line similar to that of word line WL, therefore, the block select signal can have the same waveform as the word line drive signal, and thus the DRAM can stably operate at a high speed.

[Fourth Embodiment]

Figure 11:
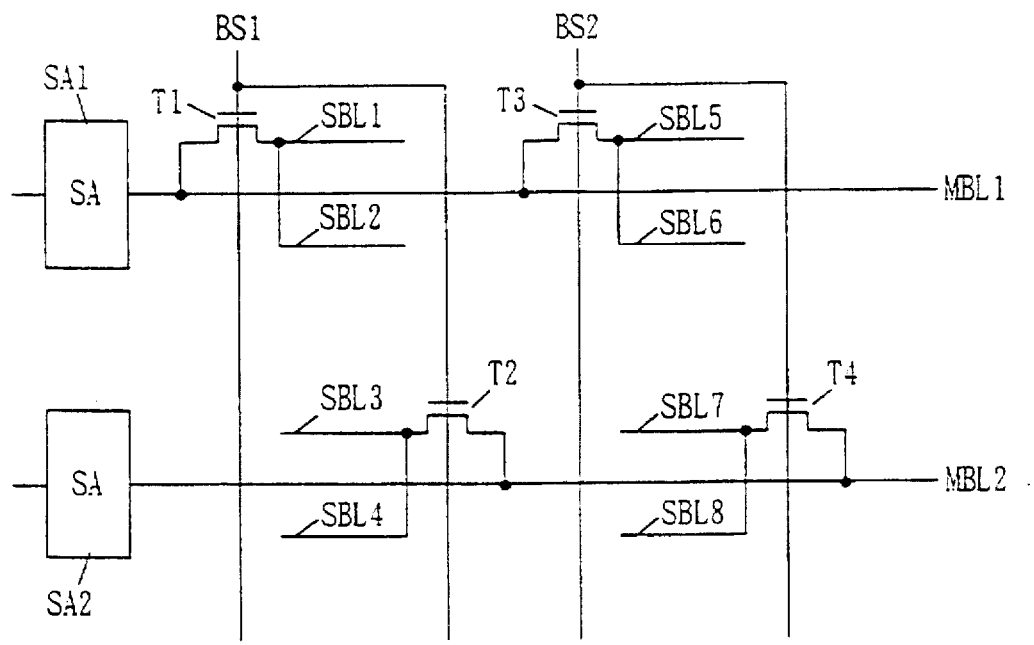
FIG. 11 schematically shows a major structure of a DRAM of a fourth embodiment of the invention.

FIG. 11 shows a major structure of a DRAM of a fourth embodiment of the invention. A structure of two main bit lines MBL1 and MBL2 and two blocks are schematically shown in FIG. 11.

In FIG. 11, sub-bit lines SBL1 and SBL2 and sub-bit lines SBL5 and SBL6 corresponding to main bit line MBL1 are connected at their left-hand ends to the main bit line MBL1 via block select switches T1 and T3, respectively. Sub-bit lines SBL3 and SBL4 and sub-bit lines SBL7 and SBL8 related to main bit line MBL2 are connected at their right-hand ends to main bit line MBL2 via block select switches T2 and T4, respectively.

All of the sub-bit line pairs related to one main bit line have the same plan pattern. The block select switches in one block, i.e., switches receiving the same block select signal are disposed alternately to each other with respect to the main bit line. Pitch of the block select switches along the block select signal line can be large, so that the block select switches can be disposed leaving a sufficient margin of area.

[Modification]

Figure 12:
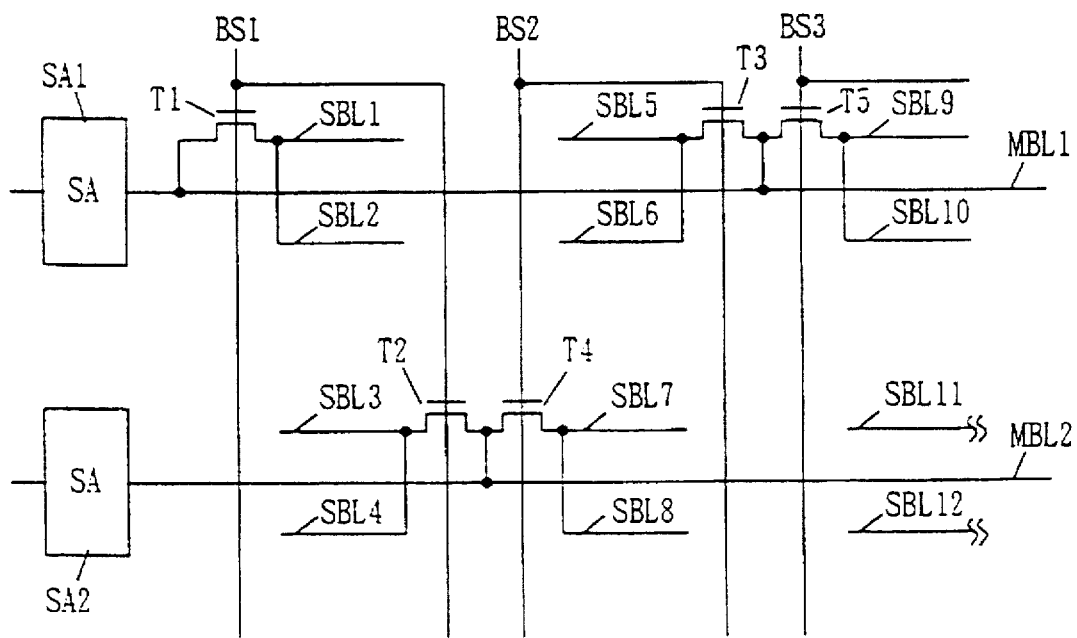
FIG. 12 shows a modification of a fourth embodiment shown in FIG. 11.

FIG. 12 shows a modification of the fourth embodiment. In the structure shown in FIG. 12, the sub-bit line pairs related to one main bit line have alternately different patterns. In connection with main bit line MBL1, sub-bit lines SBL1 and SBL2 are connected to main bit line MBL1 via block select switch T1 at the left-hand ends near sense amplifier SA1. Sub-bit lines SBL5 and SBL6 adjacent to sub-bit lines SBL1 and SBL2 are connected to main bit line MBL1 via block select switch T3 at the right-hand ends remote from sense amplifier SA1. Sub-bit lines SBL9 and SBL10 adjacent to sub-bit lines SBL5 and SBL6 are connected at the left-hand ends to main bit line MBL1 via block select switch T5.

In connection with main bit line MBL2, sub-bit lines SBL3 and SBL4 are connected at the right-hand ends to main bit line MBL2 via block select switch T2, and sub-bit lines SBL7 and SBL8 are connected at the left-hand ends to main bit line MBL2.

The block select switches are disposed at alternate ends of sub-bit lines SBL with respect to both the horizontal and vertical directions. In this case, the pitch of block select switches in the direction of extension of block select signal lines BS can be large, and adjacent block select switches T3 and T5 (or T2 and T4) commonly use the impurity region at one side, so that the block select switches occupy a reduced area.

[Dummy Word Line Arrangement]

Figure 13:
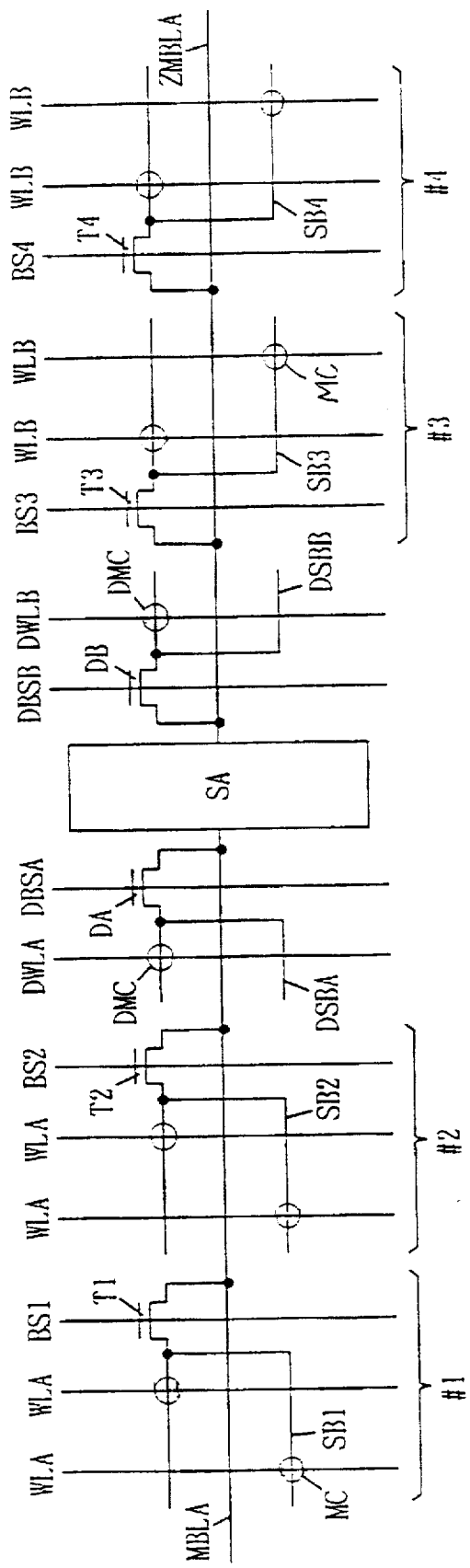
FIG. 13 shows a layout of dummy word lines in a DRAM of the invention.

FIG. 13 shows an arrangement of dummy word lines in the DRAM according to the invention. In FIG. 13, sub-bit line pair SB1 and SB2 and a dummy sub-bit line DSBA are provided for a main bit line MBLA. Sub-bit lines SB3 and SB4 as well as a dummy sub-bit line DSBB are provided for a main bit line ZMBLA. Sub-bit lines SB1 and SB2 are connected to main bit line MBLA via block select switches T1 and T2, respectively. Dummy bit line DSBA is connected to main bit line MBLA via a block select switch DA. Sub-bit lines SB3 and SB4 are connected to main bit line ZMBLA via block select switches T3 and T4, respectively. Dummy bit line DSBB is connected to main bit line ZMBLA via block select switch DB.

A block select signal DBSA applied to select switch DA is activated when the selected word line crosses main bit line ZMBLA. A block select signal DBSB applied to select switch DB is activated when a selected word line crosses main bit line MBLA.

Figure 34:
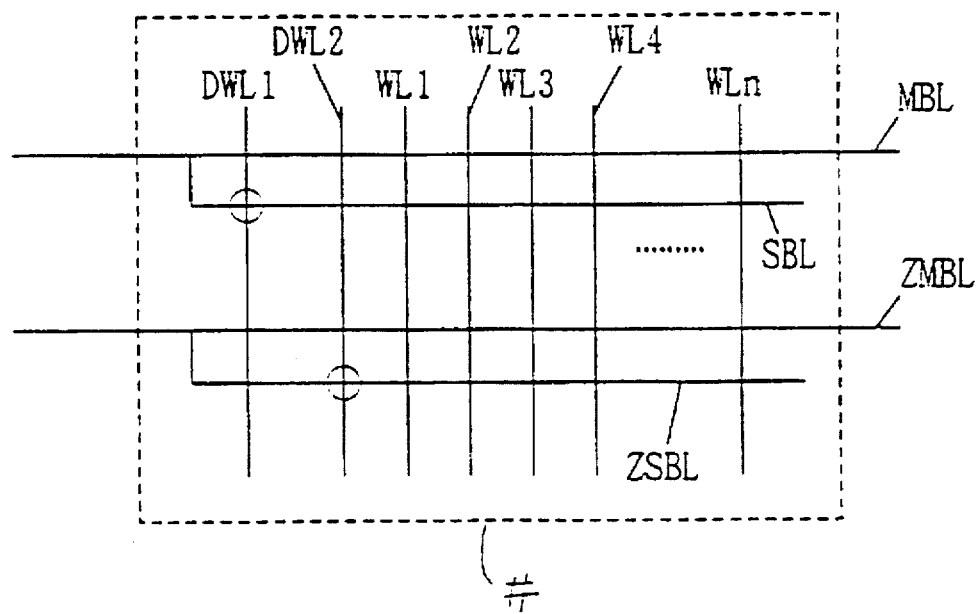
FIG. 34 shows a layout of dummy word line in the conventional DRAM.

When a word line WLA is selected, main bit line ZMBLA applies a reference potential for sense amplifier SA. Therefore, it is necessary only to connect a dummy cell DMC to main bit line ZMBLA. More specifically, regardless of the block in which the word line is selected in connection with main bit line MBLA, it is necessary only to activate one dummy word line DWLB in connection with main bit line ZMBLA and to connect dummy memory cell DMC to main bit line ZMBLA. Likewise, in the case where word line WLB is selected, it is necessary to activate dummy word line DWLA and connect dummy memory cell DMC to main bit line MBLA. Regardless of the position of selected block, it is necessary only to connect the main bit line forming a reference bit line to dummy cell DMC. Therefore, it is necessary only to provide, for one sense amplifier SA, two dummy word lines, i.e., dummy word line DWLA for connecting dummy cell DMC to main bit line MBLA and dummy word line DWLB for connecting dummy cell DMC to main bit line ZMBLA. Therefore, in comparison with the structure shown in FIG. 34, the number of dummy word lines can be reduced remarkably, and thus the area occupied by the array can be reduced.

If word line WLA is selected, sub-bit lines SB are connected to main bit line MBLA, while dummy sub-bit line DSBB is connected to main bit line ZMBLA forming the reference line. Therefore, by adjusting a parasitic capacitance of dummy sub-bit line DSBB to a value similar to that of one sub-bit line SB, capacitances of main bit lines MBLA and ZMBLA can be balanced, achieving a stable sensing operation.

Even in the structure, as shown in FIG. 3, where paired sub-bit lines are connected in a complementary manner to the corresponding main bit line via different block select switches, it is necessary to connect only one dummy memory cell to the main bit line forming the reference line, so that it is necessary to provide only two dummy word lines in total at opposite sides of one sense amplifier.

[Modification 1]

Figure 14:
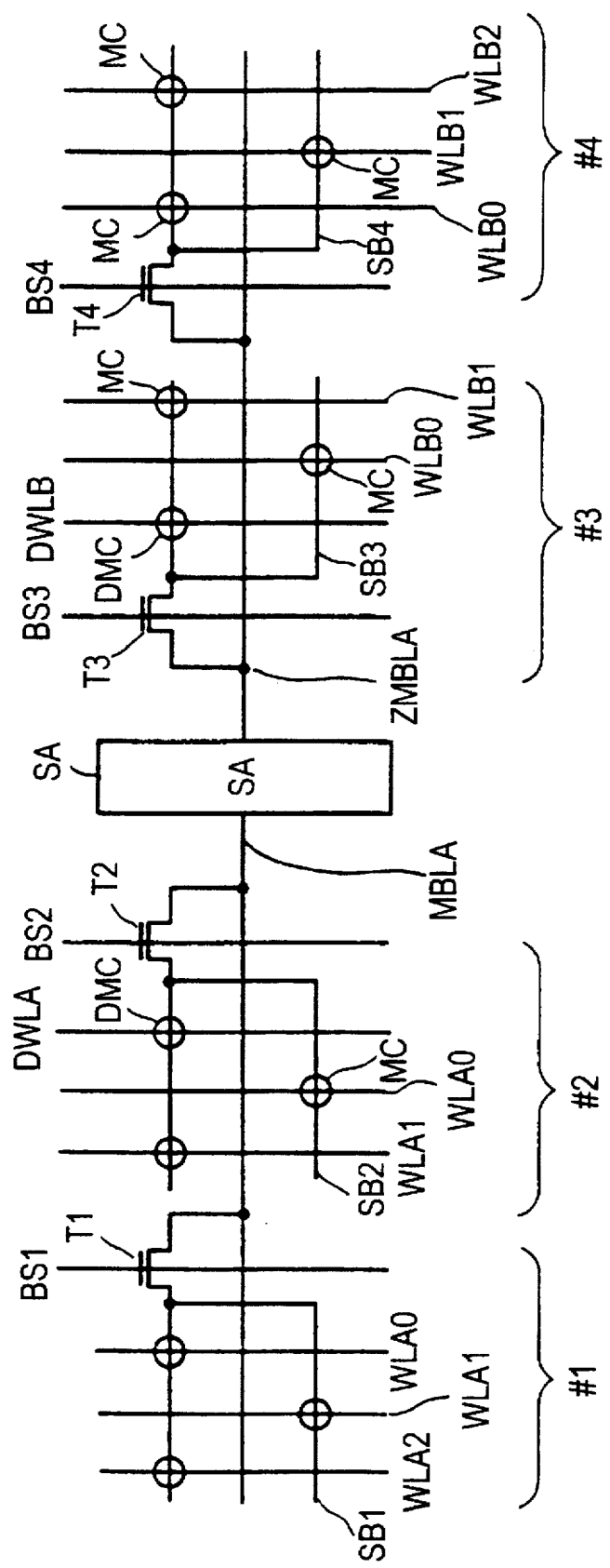
FIG. 14 shows another layout of dummy word lines.

FIG. 14 shows a first modification of a dummy cell arrangement. In FIG. 14, there are shown four memory blocks #1–#4 similarly to the arrangement in FIG. 13. In the structure shown in FIG. 14, dummy cells DMC are disposed correspondingly to the crossing of sub-bit line pair SB2 and dummy word line DWLA contained in memory block #2 and the crossing of sub-bit line pair SB3 and dummy word line DWLB contained in memory block #3. Each dummy cell DMC is provided in such a manner that it is connected to only one sub-bit line pair among those provided for main bit line MBLA, or that it is connected only to one sub-bit line pair SB3 provided for main bit line ZMBLA. Other sub-bit line pairs are not connected to the dummy cell. An operation will be briefly described below.

In the following description, it is assumed that memory cell MC in one of memory blocks #1 and #2 is selected, and particularly, that word line WLA1 contained in block #1 is selected. In this case, block select switch BS1 rises to a high level to set block select switch T1 conductive, so that sub-bit line pair SB1 is connected to main bit line MBLA.

In parallel to the above operation, block select switch BS3 rises to a high level to set block select switch T3 conductive, so that sub-bit line pair SB3 is connected to main bit line ZMBLA. Then, in block #1, word line WLA1 rises to a high level, so that data stored in the memory cell is transmitted to main bit line MBLA via block select switch T1. In parallel to the operation for selecting word line WLA1, the potential of dummy word line DWLB rises to a high level, so that data stored in dummy cell DMC contained in block #3 is transmitted to main bit line ZMBLA. The potential stored in dummy cell DMC is intermediate the potentials of data at high and low levels stored in memory cell MC. Therefore, main bit line ZMBLA stably maintains an intermediate potential (Vcc/2). Main bit lines MBLA and ZMBLA were both precharged to the intermediate potential of Vcc/2 during the standby state.

In memory block #1, the potential on sub-bit line pair SB1 may vary to generate a noise due to capacity-coupling between word line WLA1 and sub-bit line pair SB1 when potential of word line WLA1 rises. Even in this case, the same noise is generated owing to capacity-coupling between dummy word line DWLB and sub-bit line pair SB3 when selecting dummy cell DMC in memory block #3, and the noise is transmitted onto main bit line ZMBLA. Therefore, the noises generated by such capacity-coupling have the same phase on main bit lines MBLA and ZMBLA, and cancel each other during the sensing operation of sense amplifier SA, so that the sensing operation can be carried out stably. The storage potential of dummy cell DMC is the intermediate potential, and main bit line ZMBLA can stably apply the intermediate potential when the noises are canceled, so that the sense amplifier SA can stably perform the sensing operation.

Block select signal BS3 rises to a high level at the same timing as block select signal BS1 or BS2 when the word lines contained in blocks #1 and #2 are selected. Similarly, block select signal BS2 rises to a high level in parallel to block select signal BS3 or BS4 when the word line contained in block #3 or #4 is selected. Block select signals BS2 and BS3 may be selected by the structure in which a general output part for providing the block select signal from the block decoder is additionally provided with an OR gate receiving the block select signal and predetermined bit(s) (e.g., highest row address bit) of the row address, whereby block select signal BS2 or BS3 can be generated easily. In other words, this structure corresponds to a structure in which a signal formed by logical OR between block select signal BS2 and dummy cell select signal DBSA shown in FIG. 13 is generated as block select signal BS2.

According to the structure shown in FIG. 14, it is not necessary to provide dummy cell select gates DA and DB exclusively used for selecting dummy cells, which is different from the structure shown in FIG. 13, so that an area occupied by the memory cell array can be further reduced. Since one sub-bit line pair is connected to each of main bit lines MBLA and ZMBLA, both of them have the equal capacitances, so that capacitances of sense nodes of sense amplifiers SA can be well balanced, allowing a stable sensing operation.

In the structure shown in FIG. 14, dummy cell DMC is connected to the sub-bit line pair at a position nearest sense amplifier SA. However, instead of this, the dummy cell DMC may be provided in any memory cell block provided that one dummy cell DMC is connected to main bit line MBLA or ZMBLA.

[Modification 2]

Figure 15:
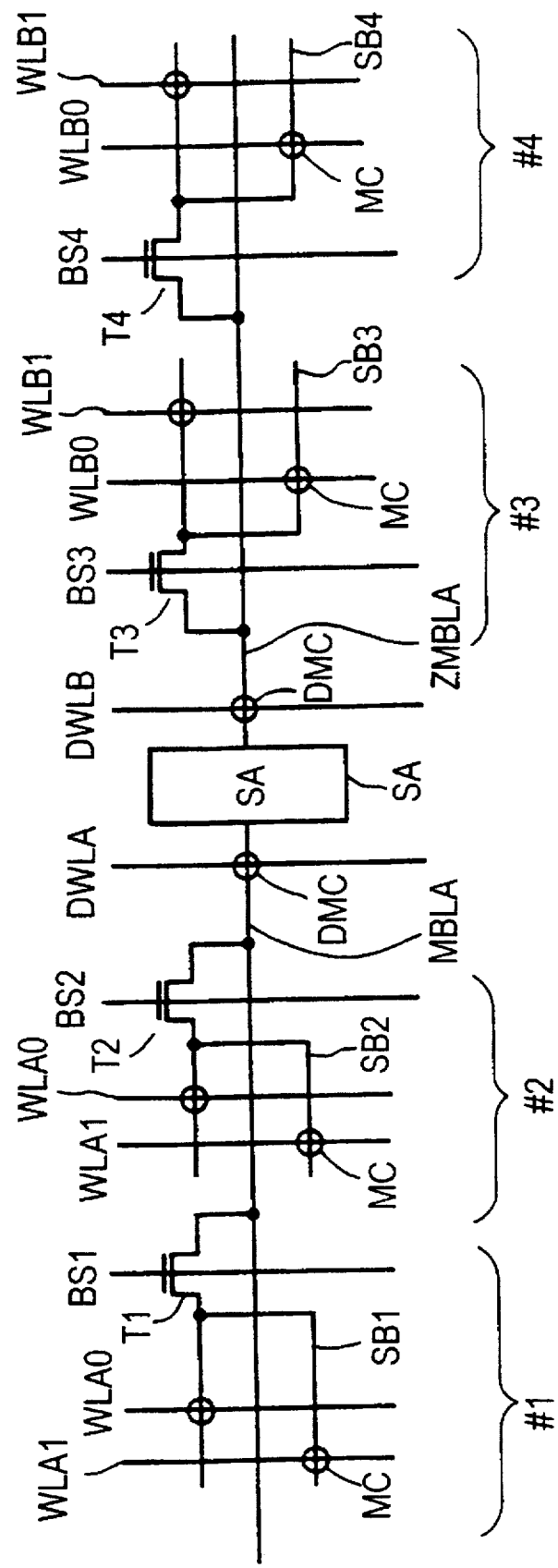
FIG. 15 shows still another layout of dummy word lines.

FIG. 15 shows a second modification of a dummy cell arrangement. In the structure shown in FIG. 15, dummy cells DMC are arranged in such a manner that they are directly connected to main bit lines MBLA and ZMBLA when dummy word lines DWLA and DWLB are selected, respectively. The dummy cell is not connected to the sub-bit line. Only memory cells MC are connected to sub-bit lines SB1, SB2, SB3 and SB4. An operation is carried out similarly to the structure shown in FIG. 14. When the word line contained in memory block #1 or #2 is selected to transmit data in the memory cell onto main bit line MBLA, the potential of dummy word line DWLB is raised to a high level, so that dummy cell DMC is connected to main bit line ZMBLA. In this operation, in order to balance capacitances of sense nodes of sense amplifier SA, block select signal BS3 rises to a high level to set block select switch T3 to the conductive state. Thereby, the sub-bit line pairs are connected to both main bit lines MBLA and ZMBLA, so that capacitances accompanying main bit lines MBLA and ZMBLA can be equal to each other, and thus sense amplifier SA can perform an accurate sensing operation.

[Dummy Cell Structure]

Figure 16:
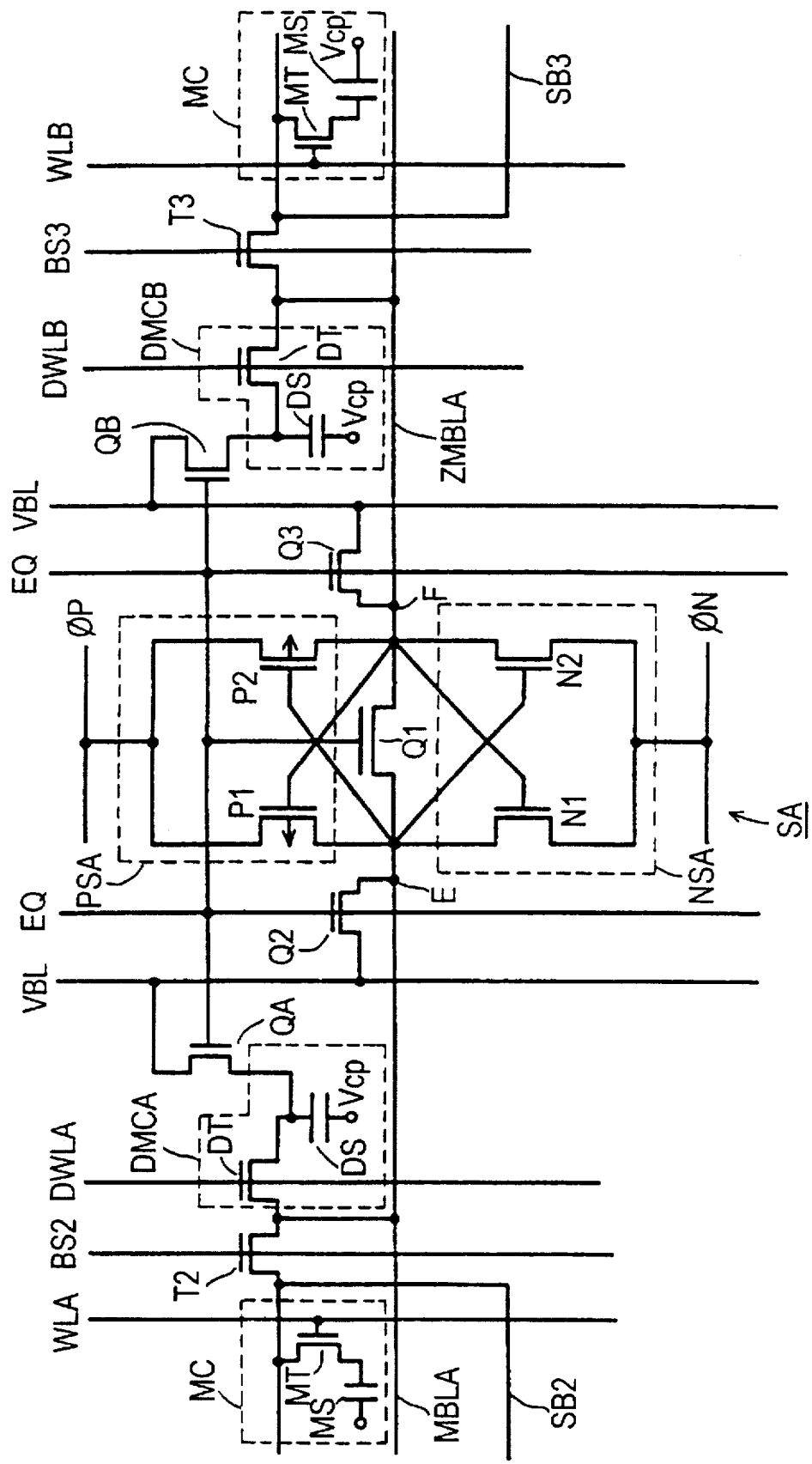
FIG. 16 shows an example of a structure of dummy cells.

FIG. 16 shows an example of a structure of dummy cells, and in particular, shows an example of the structure of dummy cells in the arrangement shown in FIG. 15. Dummy cells may be connected to sub-bit line pairs as shown in FIG. 14.

In FIG. 16, dummy cells DMCA and DMCB which are provided for main bit lines MBLA and ZMBLA, respectively, have the same structure, and include capacitors DS and access transistors DT. Access transistor DT in dummy cell DMCA is turned on to connect dummy cell capacitor DS to main bit line MBLA when a signal on dummy word line DWLA attains a high level. Access transistor DT in dummy cell DMCB is turned on to connect dummy cell capacitor DS to main bit line ZMBLA when a signal on dummy word line DWLB attains a high level.

Memory cells MC each include memory cell capacitor MS and memory cell transistor MT. Each of memory cell capacitor MS and dummy cell capacitor DS receives on its one electrode a predetermined reference potential Vcp. Memory cell capacitor MS and dummy cell capacitor DS have the same capacitance values. It is not necessary to set the capacitance of dummy cell capacitance to a half of capacitance of memory cell capacitor MS, and memory cells MC and dummy cells DMCA and DMCB can be manufactured in the same manufacturing step, so that the manufacturing process can be simplified, and thus a manufacturing cost can be reduced.

Access transistors DT of dummy cells DMCA and DMCB each have conductive regions, one of which is commonly used by adjacent block select switch T2 or T3. Thereby, an area of regions in which block select switches and dummy cells are formed can be reduced.

Sense amplifier SA includes a P-type sense amplifier PSA including cross-coupled p-channel MOS transistors P1 and P2 as well as a P-type sense amplifier NSA having cross coupled n-channel MOS transistors N1 and N2. Sense amplifier SA has the same structure as that shown in FIG. 4.

In order to precharge/equalize main bit lines MBLA and ZMBLA to an intermediate potential VBL (=Vcc/2) during the standby state, there are provide n-channel MOS transistors Q1, Q2 and Q3 which become conductive in response to an equalize signal EQ. Transistor Q1 electrically short-circuits sense nodes E and F when turned on. Transistor Q2 transmits the intermediate potential VBL to sense node E when turned on. Transistor Q3 transmits the intermediate potential VBL to sense node F when turned on. During the standby state, potentials of main bit lines MBLA and ZMBLA amplified to the high and low levels by sense amplifiers SA are equalized/precharged to intermediate potential VBL by transistors Q1–Q3.

In order to write intermediate potential VBL into dummy cells DMCA and DMCB, there are provided dummy cell precharge transistors QA and QB which are turned on in response to equalize signal EQ. Transistor QA transmits intermediate potential VBL to the storage node of capacitor DS of dummy cell DMCA when turned on. Transistor QB transmits intermediate potential VBL to the storage node of capacitor DS of dummy cell DMCB when turned on. Owing to provision of dummy cell precharge transistors QA and QB, intermediate potential VBL can be written into dummy cells DMCA and DMCB even if capacitors DS of dummy cells DMCA and DMCB each have the same capacitance as the memory cell capacitor MS, so that main bit line MBLA or ZMBLA for providing the reference potential can be surely set to intermediate potential VBL during the sensing operation.

The structure shown in FIG. 16 may be constructed to carry out an operation in such a manner that the potentials of dummy word lines DWLA and DWLB will be deactivated in response to the active state of equalize signal EQ after the potential of selected word line WL (WLA or WLB) lowers to deactivate sense amplifier SA during change of the state from the selected state to the unselected state.

[Modification 3]

Figure 17:
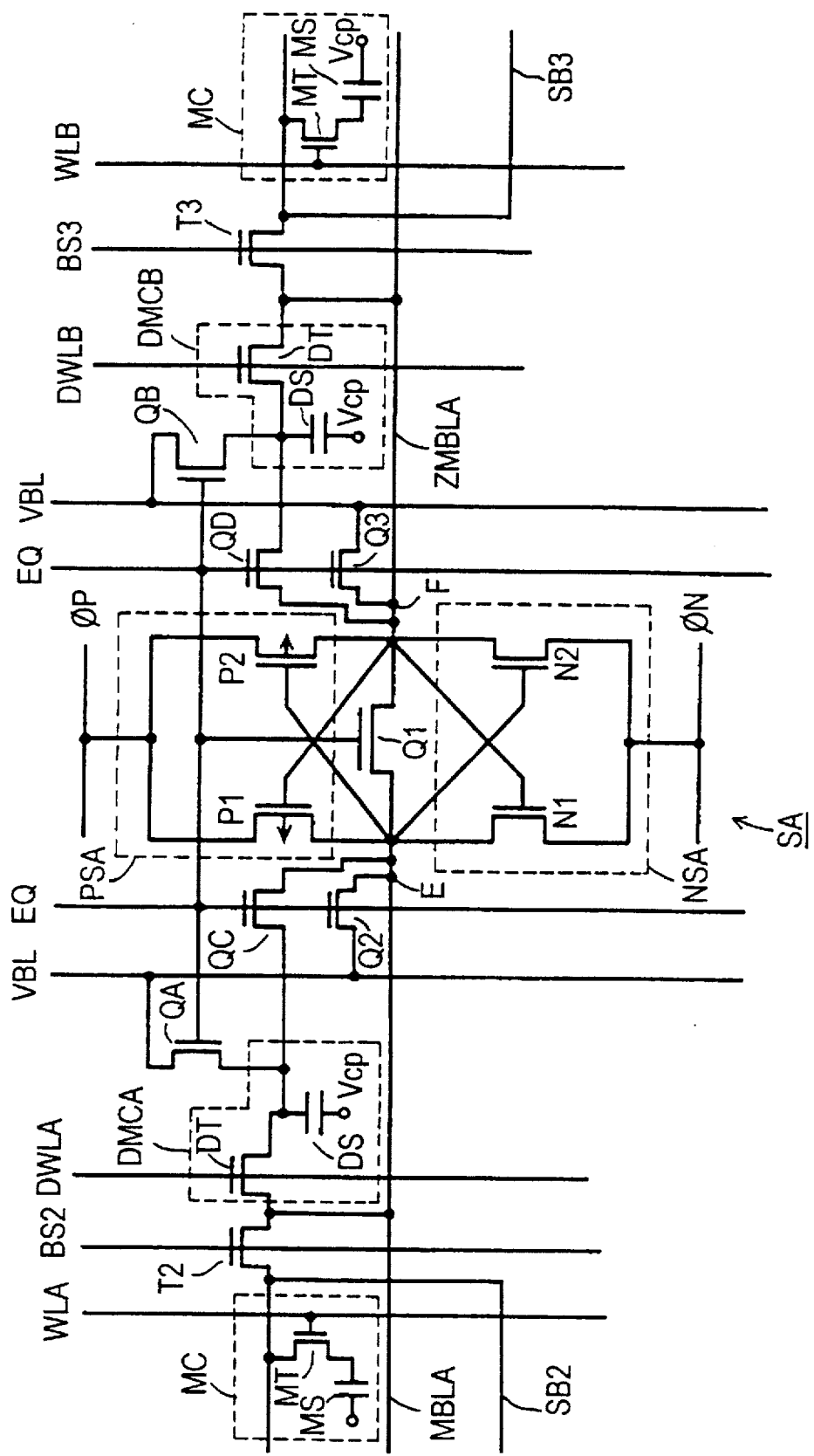
FIG. 17 shows a structure for writing a reference potential into a dummy cell.

FIG. 17 shows a modification of the dummy cell structure. The structure shown in FIG. 17 includes, in addition to the structure shown in FIG. 16, equalize transistors QC and QD which are responsive to equalize signal EQ to connect the storage nodes of capacitors DS of dummy cells DMCA and DMCB to sense nodes E and F (main bit lines MBLA and ZMBLA), respectively. Other structure in FIG. 17 is the same as that shown in FIG. 16, and corresponding portions bear the same reference characters as those shown in FIG. 16.

According to the structure shown in FIG. 17, the storage node of dummy cell capacitor DS is connected to main bit line MBLA or ZMBLA, so that precharge to intermediate potential VBL is ensured. In the structure shown in FIG. 17, when dummy word lines DWLA and DWLB are selected, they can be activated and deactivated in accordance with the same waveform as selected word line WL (WLA or WLB). Activation/deactivation of these dummy word lines DWLA and DWLB can be controlled easily.

Also in the structure shown in FIG. 17, precharge transistors QA and QB of dummy cells DMCA and DMCB may be eliminated, because the storage node of dummy cell capacitor DS receives intermediate potential VBL via transistors Q2 and QC or transistors Q3 and QD.

The structures shown in FIGS. 16 and 17 are provided with I/O gates near the sense amplifier for connecting main bit lines MBLA and ZMBLA to internal data lines IO and /IO in response to column select signal CSL. However, these gates are not show in the figures for simplicity reasons.

[Modification of Dummy Cell Drive]

Figure 18:
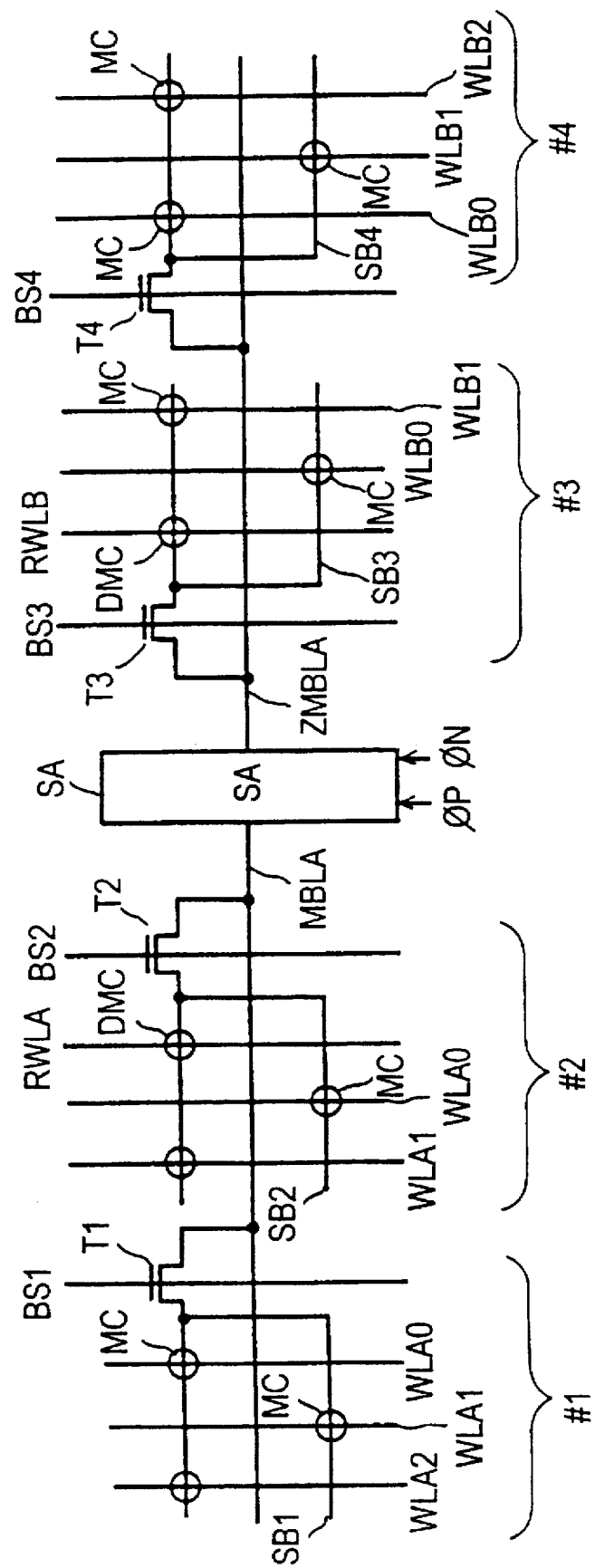
FIG. 18 shows yet another layout of dummy word lines.

FIG. 18 shows a modification of a structure for driving dummy word lines. The structure in FIG. 18 differs from the structure in FIG. 14 in that antiphase dummy word line drive signals RWLA and RWLB are used instead of dummy word line drive signals DWLA and DWLB. Other structure is the same as that shown in FIG. 14, and corresponding portions bear the same reference characters. Dummy cell DMC have the same structure as the memory cell MC, and includes a capacitor having the same capacitance as that of memory cell MC. Now, an operation for driving dummy word lines by the structure in FIG. 18 will be described below with reference to operation waveform diagrams of FIGS. 19(a) to 19(f).

In the standby state, the main bit lines MBLA and ZMBLA are precharged to intermediate potential VBL (Vcc/2). Sub-bit line pairs SB1–SB4 are likewise precharged to the intermediate potential.

Upon start of the memory cell selecting operation, block select signal BS first rises to a high level in accordance with the address signal (row address signal and block address signal), and then the potential of selected word line WL rises. FIGS. 19(a) to 19(f) show, as an example, a state in which word line WLA0 is selected in memory block #2. In this case, block select signals BS2 and BS3 rise to a high level, so that sub-bit line pairs BS2 and BS3 rise to a high level, and sub-bit line pairs SB2 and SB3 are connected to main bit lines MBLA and ZMBLA, respectively. In parallel to the rise of potential of the selected word line, antiphase dummy word line drive signal RWLA lowers to a low level. Other antiphase dummy word line drive signal RWLB maintains a high level. When the potential of selected word line WLA0 rises, a capacity-coupling noise may appear on the sub-bit line pair SB2 due to capacity-coupling between selected word line WLA0 and sub-bit line pair SB2 via the access transistor. In this case, antiphase dummy word line drive signal RWLA may be lowered to a low level, whereby a noise, which has a phase opposite to that of the noise due to capacity-coupling between selected word line WLA0 and sub-bit line pair SB2, generates between dummy word line RWLA and sub-bit line pair SB2, canceling the capacity-coupling noise, so that memory cell data can be accurately transmitted onto sub-bit line pair SB2 and main bit line MBLA. In connection with the main bit line ZMBLA, block select signal BS3 rises to a high level, and antiphase dummy word line drive signal RWLB is high, so that the stored data of the intermediate potential of dummy cell DMC connected to main bit line ZMBLA is transmitted to this main bit line ZMBLA, so that the main bit line ZMBLA can be surely set to the intermediate potential.

Figure 19:
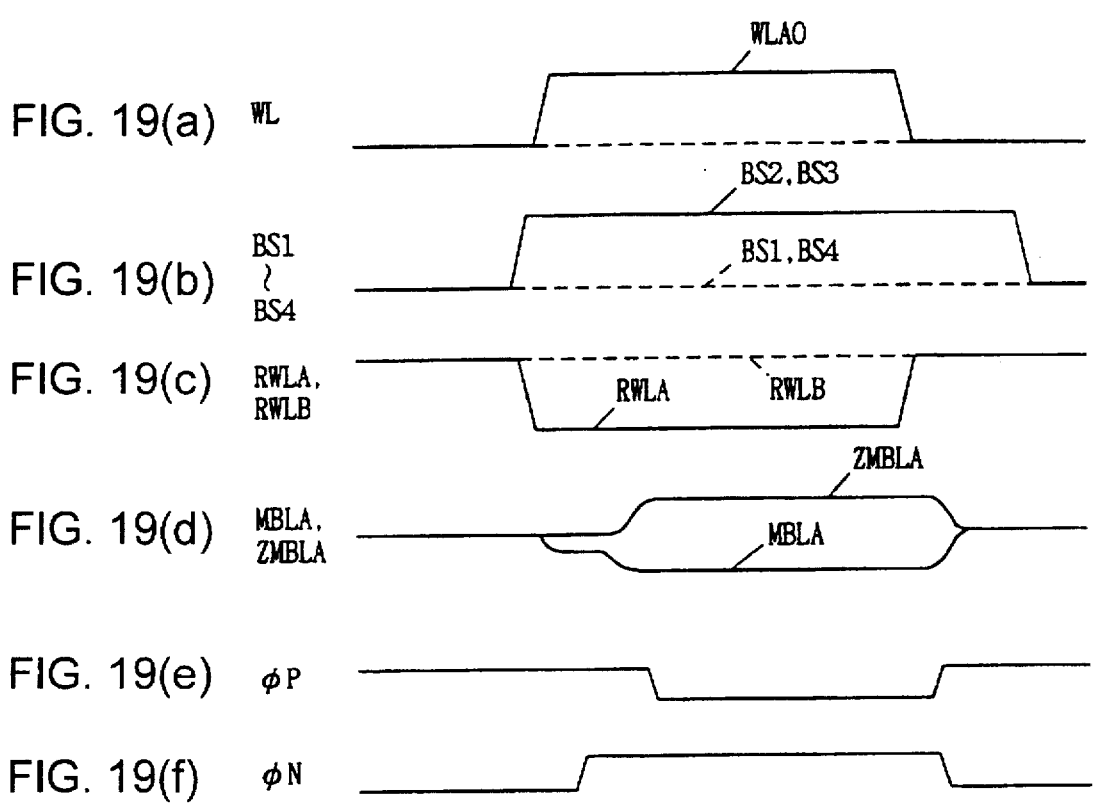
FIGS. 19(a) to 19(f) are signal waveform diagrams showing an operation of the structure shown in FIG. 18.

Also in the structure shown in FIG. 18, only one dummy cell DMC is provided for each of main bit lines MBLA and ZMBLA, so that a stable sensing operation can be performed without increasing an area occupied by a memory cell array. Sense amplifier activating signals φN and φP change to high and low levels, respectively, sense amplifier SA starts the sensing operation, and potentials on main bit lines MBLA and ZMBLA change to high and low levels in accordance with data stored in memory cell MB, respectively. FIG. 19 shows, as an example, a state where the potentials of main bit lines MBLA and ZMBLA change in the case where the data of selected memory cell is low.

When read or write operation with respect to the memory cell is completed, the potential of selected word line WLA0 lowers to a low level, and the antiphase dummy word line drive signal RWLA rises to a high level. Thereafter, sense amplifier activating signals φN and φP return from the high and low levels to the intermediate level, respectively, and the sense amplifier SA is deactivated. Then, not shown equalize signal (see, e.g., FIGS. 16 and 17) rises to a high level, and main bit lines MBLA and ZMBLA are equalized/precharged, so that the potentials of main bit lines MBLA and ZMBLA return to the intermediate potential VBL. Thereafter, block select signals BS2 and BS3 lower to a low level. When equalizing and precharging main bit lines MBLA and ZMBLA, both antiphase dummy word line drive signals RWLA and RWLB become high. Therefore, data of the intermediate potential level can be surely written into dummy cell DMC without requiring a particular circuit for writing the intermediate potential.

Also in the structure shown in FIG. 18, the sensing operation can be stably performed without increasing an area occupied by the memory cell array.

When memory cell MC belonging to memory cell block #1 is selected, block select signals BS1 and BS2 become high, and block select signal BS3 becomes high. In this case, such a structure may be employed, in order to balance the capacitances of main bit lines MBLA and ZMBLA with respect to sense amplifier SA, that block select signal BS2 is nonconductive before the activation of sense amplifier and will attain a high level after completion of the sensing operation.

Figure 20:
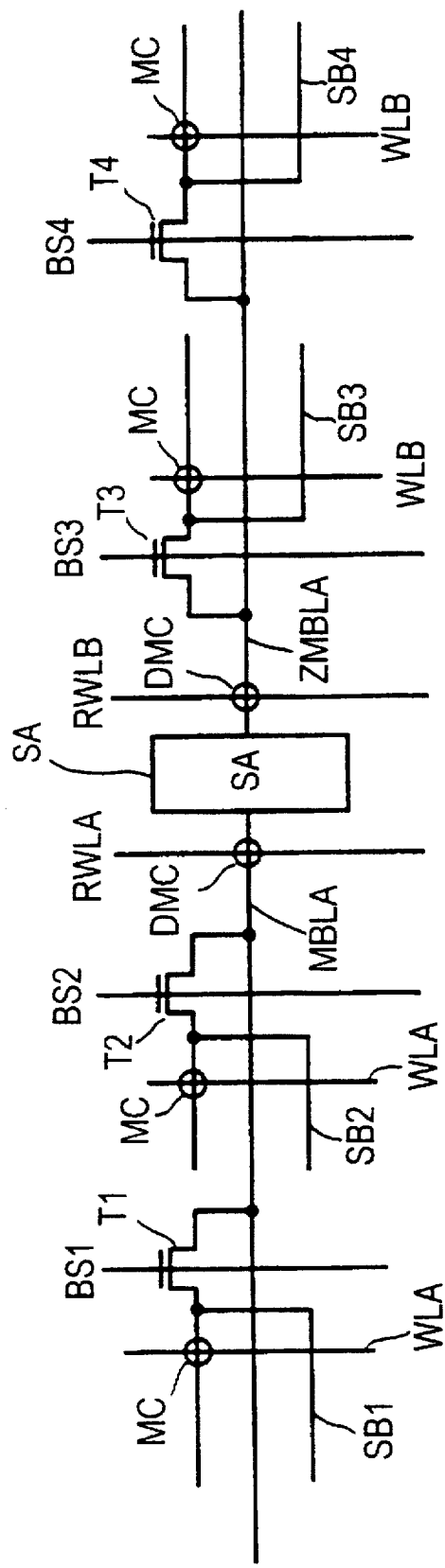
FIG. 20 shows a modification of a layout shown in FIG. 18.

FIG. 20 shows still another modification of a structure for driving the dummy word line. In the structure shown in FIG. 20, dummy cells DMC are connected to main bit lines MBLA and ZMBLA. Dummy cell DMC provided for main bit line MBLA receives antiphase dummy word line drive signal RWLA. Dummy cell DMC provided for main bit line ZMBLA receives antiphase dummy word line drive signal RWLB. Antiphase dummy word line drive signals RWLA and RWLB are driven in the same manner as the structure shown in FIG. 18. When data is transmitted from the selected memory cell to main bit line MBLA, antiphase dummy word line drive signal RWLA lowers to a low level. The other antiphase dummy word line drive signal RWLB maintains a high level. At this time, block select signal BS3 is also high. Thereby, one bit line pair is connected to main bit lines MBLA and ZMBLA, and memory cell MC is connected to main bit line MBLA. Also, dummy cell DMC is connected to main bit line ZMBLA. Therefore, bit line capacitances related to sense nodes of sense amplifiers SA can be equal to each other, and thus a stable sensing operation can be performed.

[Structure for Canceling Noises]

Figure 21:
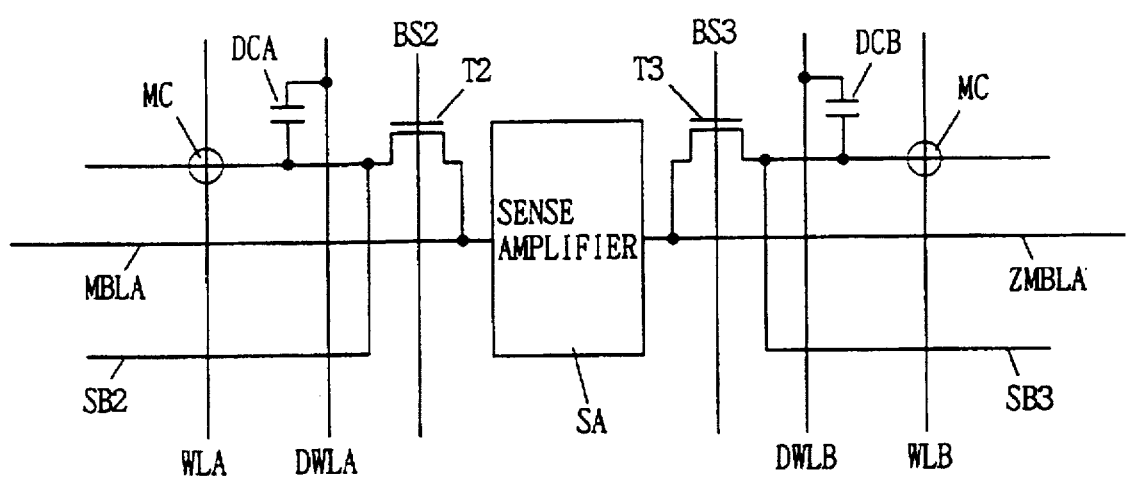
FIG. 21 shows another structure for driving dummy cells.

FIG. 21 shows a structure for canceling noises. In FIG. 21, there are provided a dummy capacitor DCA for capacity-coupling dummy word line DWLA and sub-bit line pair SB2, and a dummy capacitor DCB for capacity-coupling dummy word line DWLB and sub-bit line pair SB3. These dummy capacitors DCA and DCB are provided only for sub-bit line pairs SB2 and SB3, respectively. A dummy capacitor is not provided for the remaining sub-bit line pairs which are not shown in FIG. 21.

The dummy word lines DWLA and DWLB are driven in the same manner as the case where dummy cells DMC are provided. For example, when the word line WLA is selected, the potential of dummy word line DWLB rises to a high level. A noise of the same magnitude as the noise due to capacity-coupling between word line WLA and sub-bit line pair SB2 generates between dummy word line DWLB and sub-bit line pair SB3 via dummy capacitor DCB. Thereby, noises of the same phase generate on main bit lines MBLA and ZMBLA, so that these noises cancel each other owing to differential amplification by sense amplifier SA, which enables a stable sensing operation.

Dummy capacitors DCA and DCB may use MOS transistors of the same size as the access transistors contained in memory cells MC, whereby capacity-coupling of the same capacitance as the capacity-coupling formed between the word line and sub-bit line pair via the selected memory cell can be produced between the dummy word line and sub-bit line pair.

Dummy capacitors DCA and DCB shown in FIG. 21 may use capacitors having electrodes made of polysilicon instead of the MOS capacitors described above.

Figure 22:
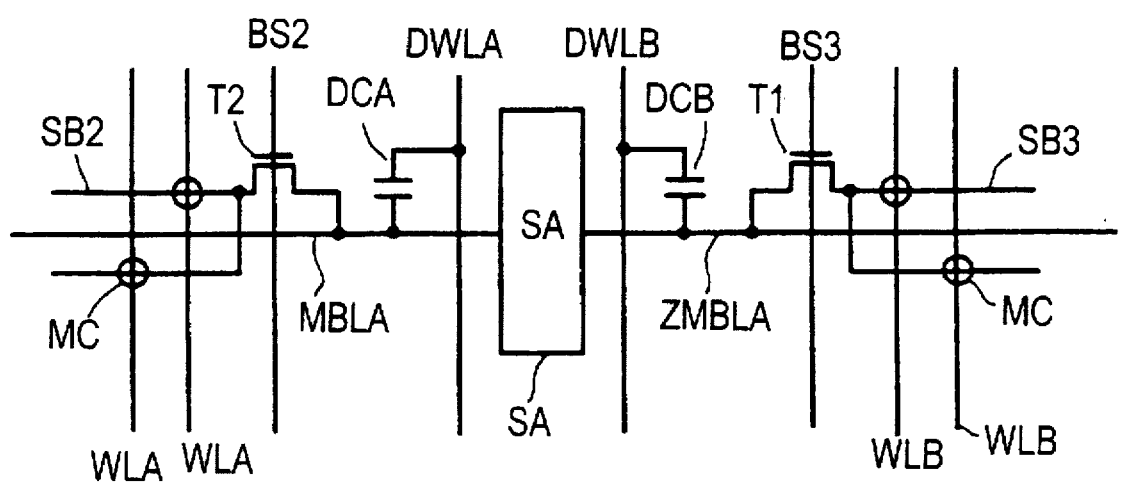
FIG. 22 shows still another structure for driving dummy cells.

FIG. 22 shows a modification of the structure shown in FIG. 21. In the structure shown in FIG. 22, dummy capacitors DCA and DCB are connected to main bit lines MBLA and ZMBLA. Only memory cells MC are disposed at crossings between the sub-bit line pairs (FIG. 22 representatively shows only sub-bit line pairs SB2 and SB3) and word lines. Dummy word lines DWLA and DWLB are driven in a manner similar to that of the structure shown in FIG. 21. In order to keep balance of capacitances related to the sense nodes of sense amplifiers SA, one sub-bit line pair is connected to the main bit line applying the reference potential. For example, when data of memory cell MC is transmitted to sub-bit line pair SB2, the potential of dummy word line DWLB rises to a high level. At this time, block select signal BS3 also rises to a high level, and sub-bit line pair SB3 is connected to main bit line ZMBLA. Thereby, capacitances related to the sense nodes of sense amplifier SA can be substantially equal to each other.

Figure 23:
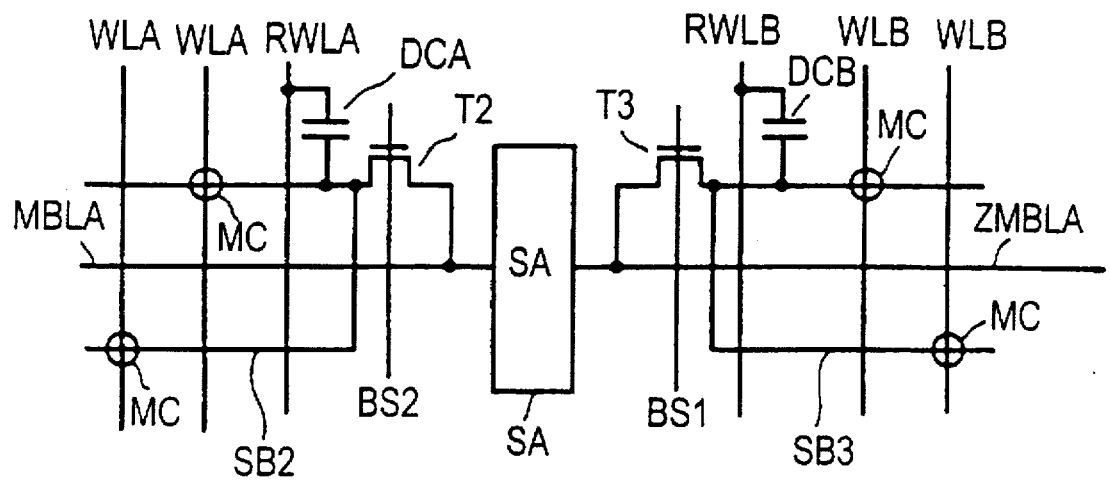
FIG. 23 shows yet another structure for driving dummy cells.
Figure 30:
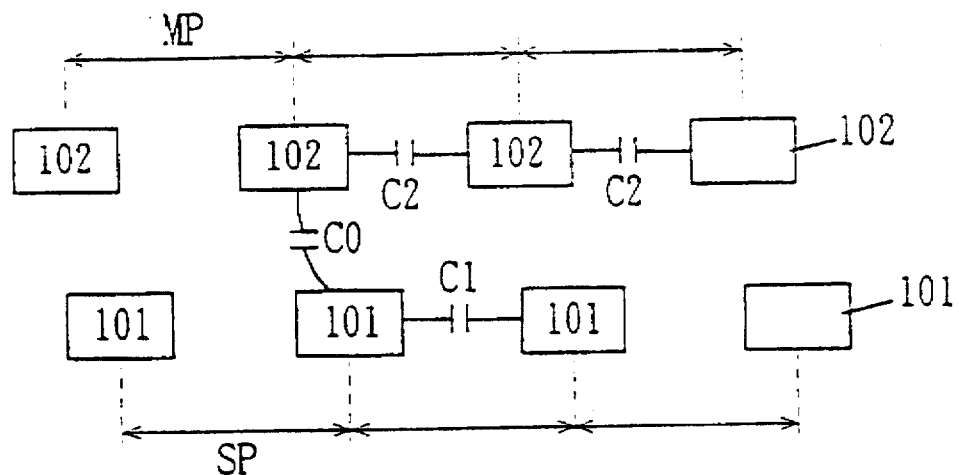
FIG. 30 is a diagram showing a disadvantage of the hierarchical bit line arrangement in the prior art.
Figure 31:
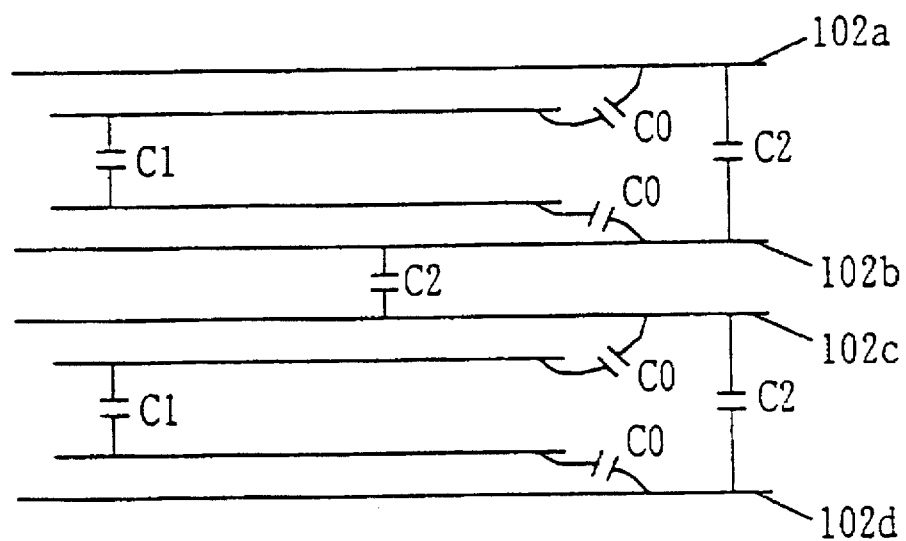
FIG. 31 is a diagram showing a disadvantage of the hierarchical bit line arrangement in the prior art.
Figure 32:
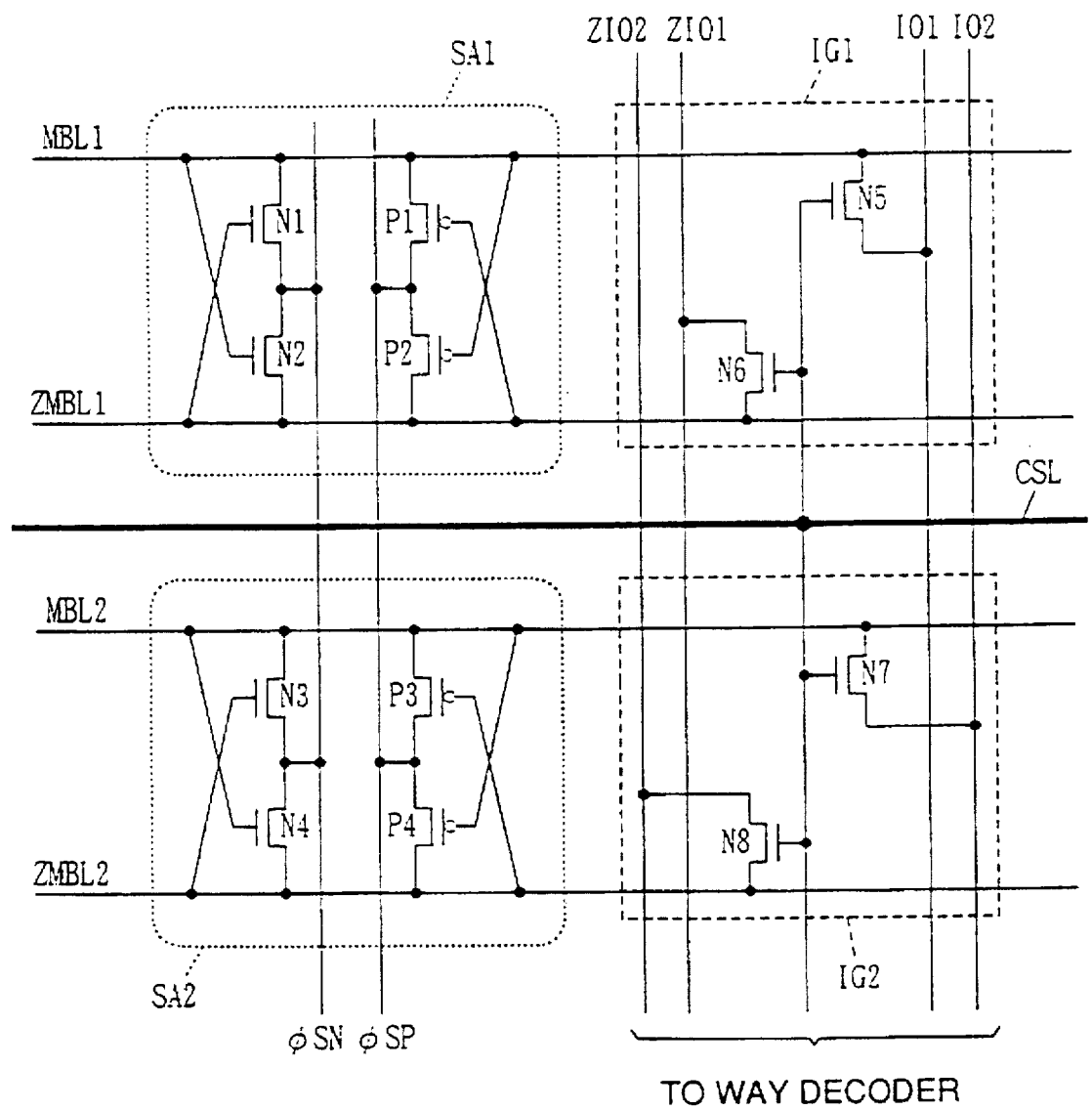
FIG. 32 shows a structure of a sense amplifier portion in the conventional DRAM.
Figure 33:
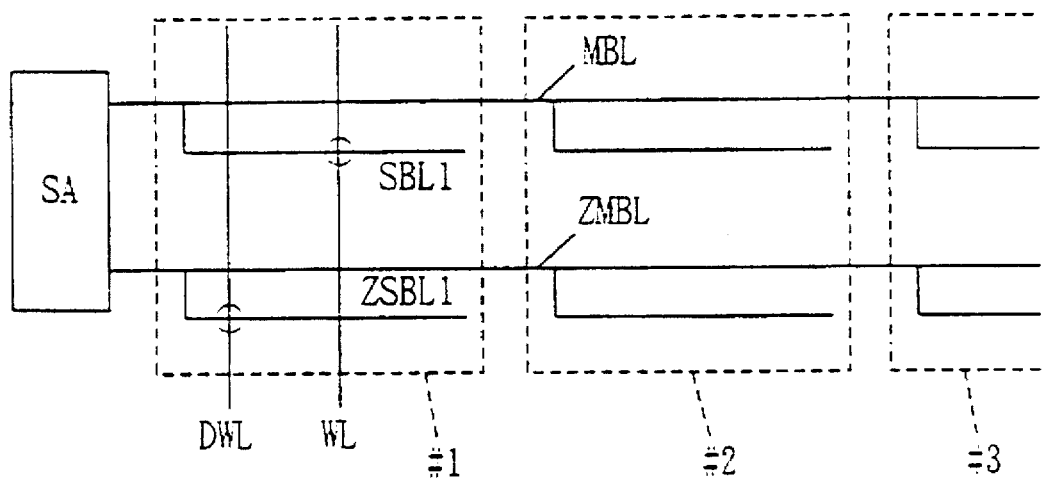
FIG. 33 shows a layout of dummy word lines in the conventional DRAM having a hierarchical bit line arrangement.

FIG. 23 shows still another structure for canceling noises. In the structure shown in FIG. 23, dummy capacitor DCA couples antiphase dummy word line drive signal transmission line RWLA and main bit line MBLA to each other, which is different from the structure shown in FIG. 21. Dummy capacitor DCB couples antiphase dummy word line drive signal transmission line RWLB and main bit line ZMBLA together. Antiphase dummy word line drive signal transmission lines RWLA and RWLB are the same as those shown in FIGS. 18 and 30. Dummy capacitors DCA and DCB are similar to those shown in FIGS. 21 and 22, and is formed of MOS capacitors or capacitors using polysilicon as the electrode layer. Even the structure shown in FIG. 23 can achieve the effect similar to that of the structures shown in FIGS. 18 and 20. Difference is only that dummy capacitors DCA and DCB are used instead of dummy cells DMC. The structure shown in FIG. 23 operates similarly to the structure shown in FIG. 18.

Figure 24:
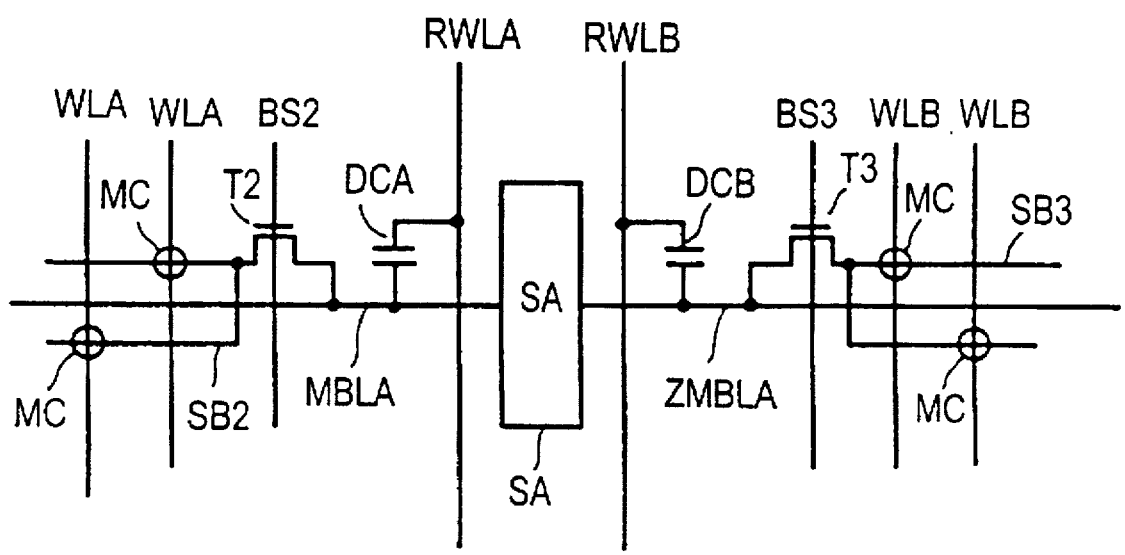
FIG. 24 shows further another structure for driving dummy cells.

FIG. 24 shows further another structure for canceling noises. In FIG. 24, dummy capacitor DCA couples antiphase dummy word line drive signal transmission line RWLA and main bit line MBLA together, and dummy capacitor DCB couples antiphase dummy word line drive signal transmission line RWLB and main bit line ZMBLA together. Dummy capacitors DCA and DCB are formed of MOS capacitors or capacitors using polysilicon as the electrode layer. The structure shown in FIG. 24 operates in a manner similar to the structure shown in FIG. 20, and can achieve the same effect.

In the structures described above, the dummy cells or dummy capacitors are used for a hierarchical bit line arrangement in which both the main bit lines and sub-bit lines form the open bit line arrangements. However, the structure itself of the dummy cell or dummy capacitor can be applied to a general hierarchical bit line arrangement including sub-bit lines to which memory cells are directly connected and main bit lines to which a plurality of sub-bit lines are selectively connected.

[Application to Sense Amplifier of a Latch Type]

FIGS. 25A and 25B(1) to 25B(4) show a structure in which the hierarchical bit line arrangement according to the invention is applied to a sense amplifier of a latch type, and also schematically shows an operation of the same. In FIG. 25A, sub-bit line SBL is connected to main bit line MBLA via a block select switch Ta. Sub bit line ZSBL is connected to main bit line ZMBL via a block select switch Tb. Block select switches Ta and Tb are responsive to block select signals BSA and BSB to become conductive, respectively. Main bit lines MBL and ZMBL are connected to sense amplifier SA via connection switches LTa and LTb, respectively. Sense amplifier SA is formed of cross-coupled MOS transistors similarly to sense amplifier SA already described.

Sense amplifier drive signal φS applied to sense amplifier SA includes a signal φSN for driving n-channel sense amplifier, which is formed of n-channel MOS transistors, and a signal φSP for driving a sense amplifier portion formed of p-channel MOS transistors. A sensing operation of the sense amplifier of the latch type will be briefly described below with reference to operation waveform diagrams in FIGS. 25B(1) to 25B(4).

It is assumed that the word line crossing paired sub-bit lines SBL is selected. In this case, block select signal BSA rises to a high level, and block select switch Ta becomes conductive. Block select signal BSB maintains a low level. Connection control signals φC and φD are high, and switches LTa and LTb maintain the conductive state.

When the potential of selected word line rises to a high level, data of the memory cell connected to the selected word line is transmitted to sense amplifier SA via sub-bit line SBL, switch Ta, main bit line MBL and switch LTa. Main bit line ZMBL applies the reference voltage. After the potential of selected word line rose and data of selected memory cell was transmitted to sense amplifier SA, connection control signals φC and φD lower to and maintain a low level for a predetermined period, and switches LTa and LTb are turned off. In this state, sense amplifier drive signal φS is activated, and sense amplifier SA performs the sensing operation.

Sense amplifier SA differentially amplifies the potential difference between their nodes (nodes E and F in FIG. 2). The sense node has already received the read data. Since switches LTa and LTb are off, the load on sense amplifier SA is extremely small, and the sense node is driven at a high speed in accordance with the potential thereof.

When the sensing operation is completed, connection control signals φC and φD rise to a high level, and a restoring operation for selected memory cell data is performed. As described above, the sensing operation is performed with electrical charges confined to the sense node of sense amplifier, whereby the sensing operation can be performed at a high speed without being affected by a bit capacity.

The sense amplifier of the latch type having the structure described above is provided with connection control switches LTa and LTb. For sub-bit lines SBL and ZSBL nearest sense amplifier SA are provided at their ends near sense amplifier SA with block select switches Ta and Tb, respectively. Owing to this structure, block select switch Ta and connection control switch LTa can commonly use the impurity region, and thus occupy a reduced area. Likewise, switches Tb and LTb can commonly use the impurity region, and thus occupy a reduced area.

[Block Select Signal Generating System]

Figure 26:
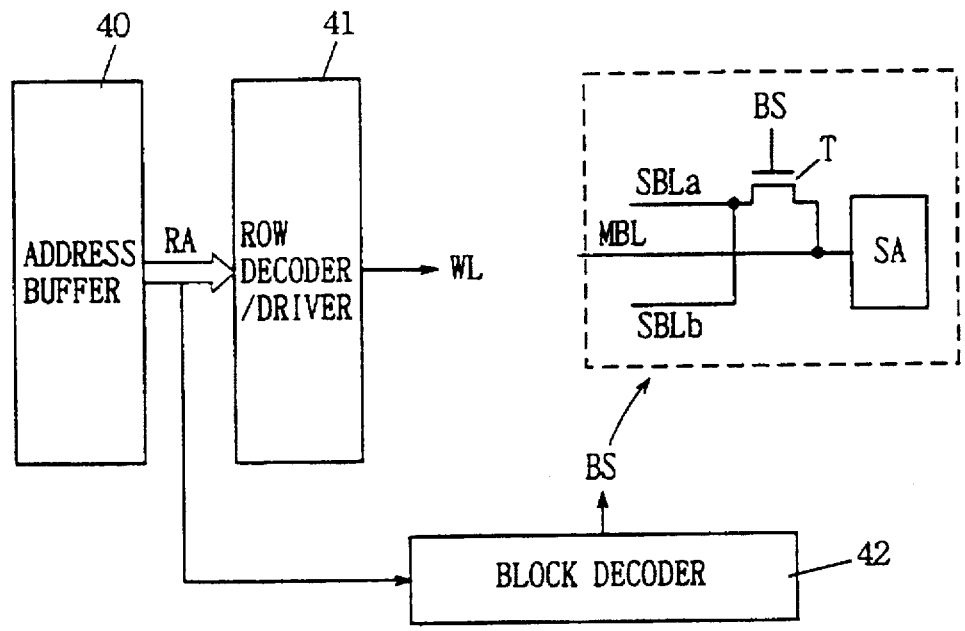
FIG. 26 shows a structure of a system generating a block select signal used in the invention.

FIG. 26 shows a circuit structure for generating the block select signals. In FIG. 26, an address buffer 40 produces an internal row address signal RA from the applied address signal, and applies the same to a row decoder/driver 41. Row decoder/driver 41 decodes internal row address signal RA and transmits word line drive signal WL onto the selected word line. A predetermined number of bits of internal row address signal RA sent from address buffer 40 are applied to a block decoder 42. The number of bits of the row address signal applied to block decoder 42 depends on the number of blocks in the memory array. Block decoder 42 decodes a predetermined number of bits of the row address signal, and transmits active block select signal BS to the block select switch provided for the block containing the selected word line. By using block decoder 42 shown in FIG. 26, the sub-bit lines related to the selected word line can be connected to the corresponding main bit line MBL in the case where two sub-bit lines SBLa and SBLb related to main bit line MBL are connected to the main bit line via one block select switch T as shown within a block represented by broken line.

Figure 27:
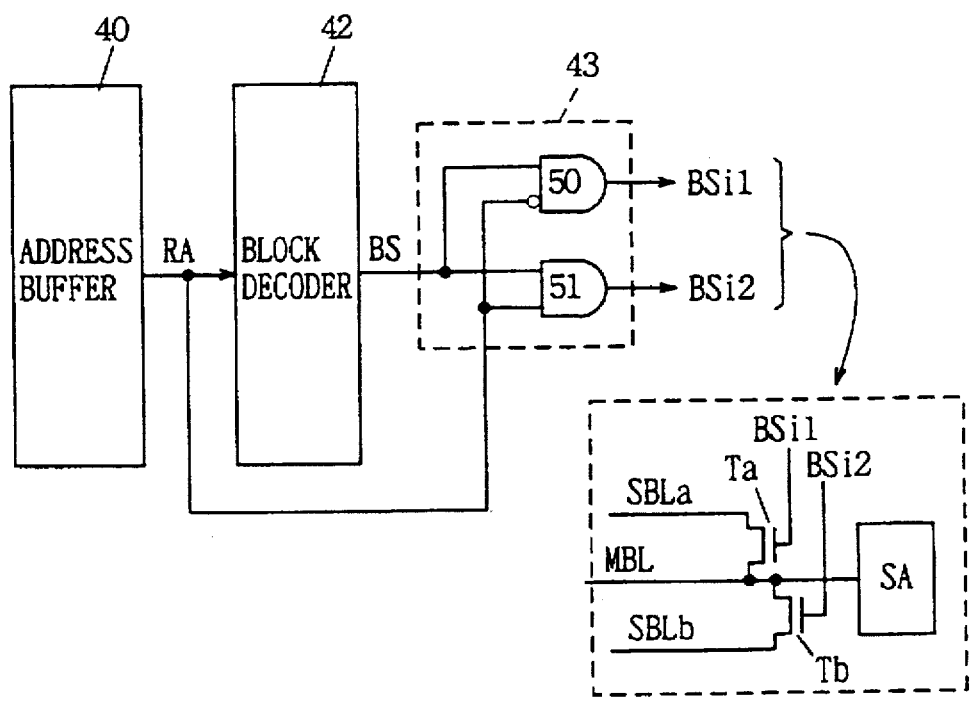
FIG. 27 shows another structure of a system generating a block select signal used in the invention.

FIG. 27 shows another structure of a block select signal generating system. In FIG. 27, the block select signal generating system includes block decoder 42 shown in FIG. 26 as well as a decode circuit 43 which decodes the output of block decoder 42 in accordance with the address signal of 1 bit sent from address buffer 43. Decode circuit 43 includes a gate circuit 50, which receives block select signal BS from block decoder 42 on its one input and also receives one bit of the row address signal (e.g., lowest bit) from address buffer 40 on its other input, and a gate circuit 51 which receives block select signal BS sent from block decoder 42 as well as predetermined address signal bits.

Gate circuit 50 provides a block select signal BSi1, and gate circuit 51 provides a block select signal BSi2. In this structure, there are provided paired sub-bit lines SBLa and SBLb for main bit line MBL as shown within a block represented by broken line, only one sub-bit line SBLa or SBLb is connected to main bit line MBL by a pair of block select switches Ta and Tb. When one of gate circuits 50 and 51 attains the selected state, the other attains the unselected state. When block select signal BS is in the unselected state, both block select signals BSi1 and BSi2 are in the unselected state. Therefore, only one of sub-bit lines can be connected to the corresponding main bit line.

By using the block decoders shown in FIGS. 26 and 27, dummy word line drive signals DWL and RWL can be produced from word line drive signal WL.

Figure 28:
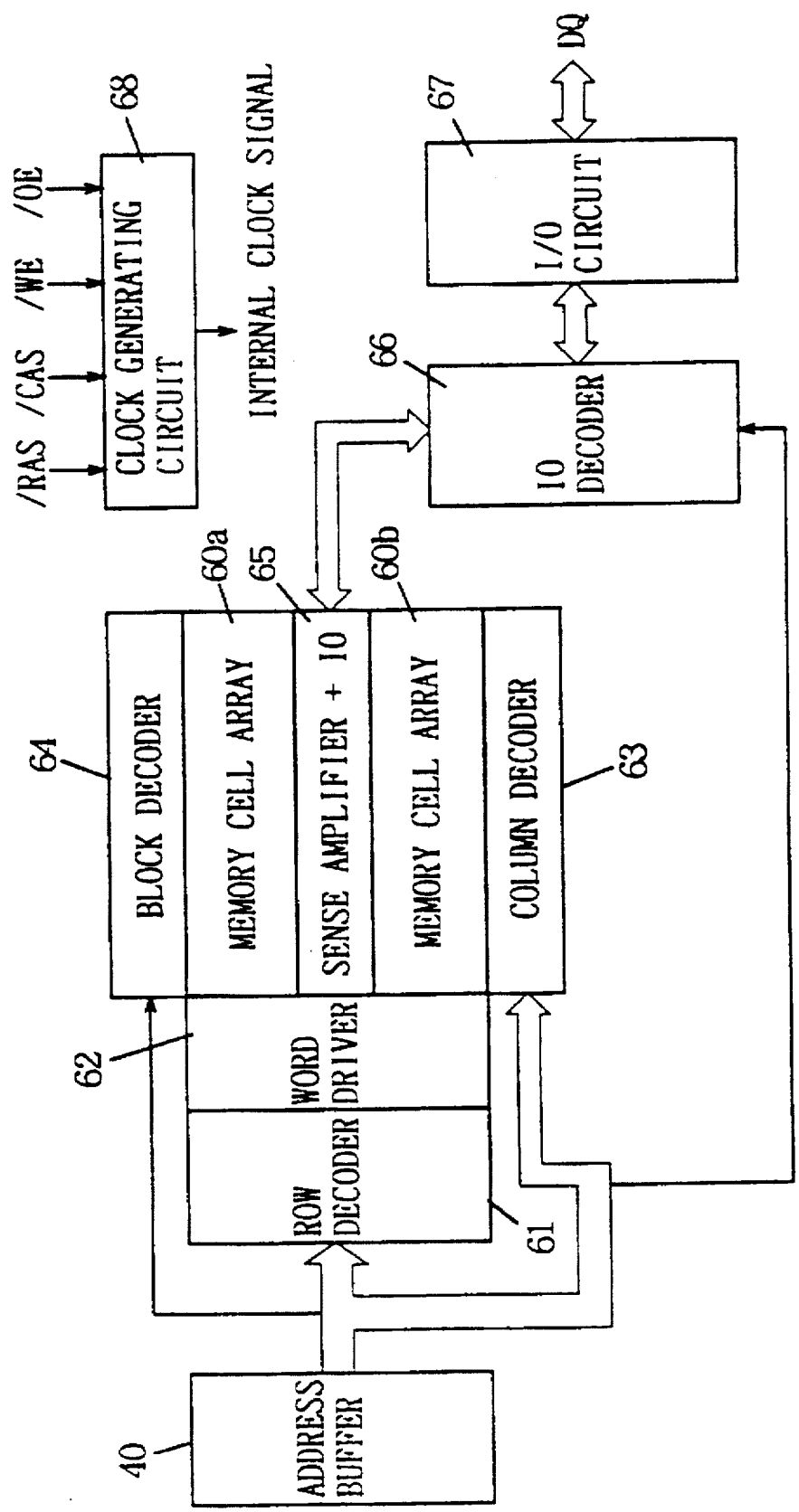
FIG. 28 schematically shows an overall structure of a DRAM of the invention.
Figure 29:
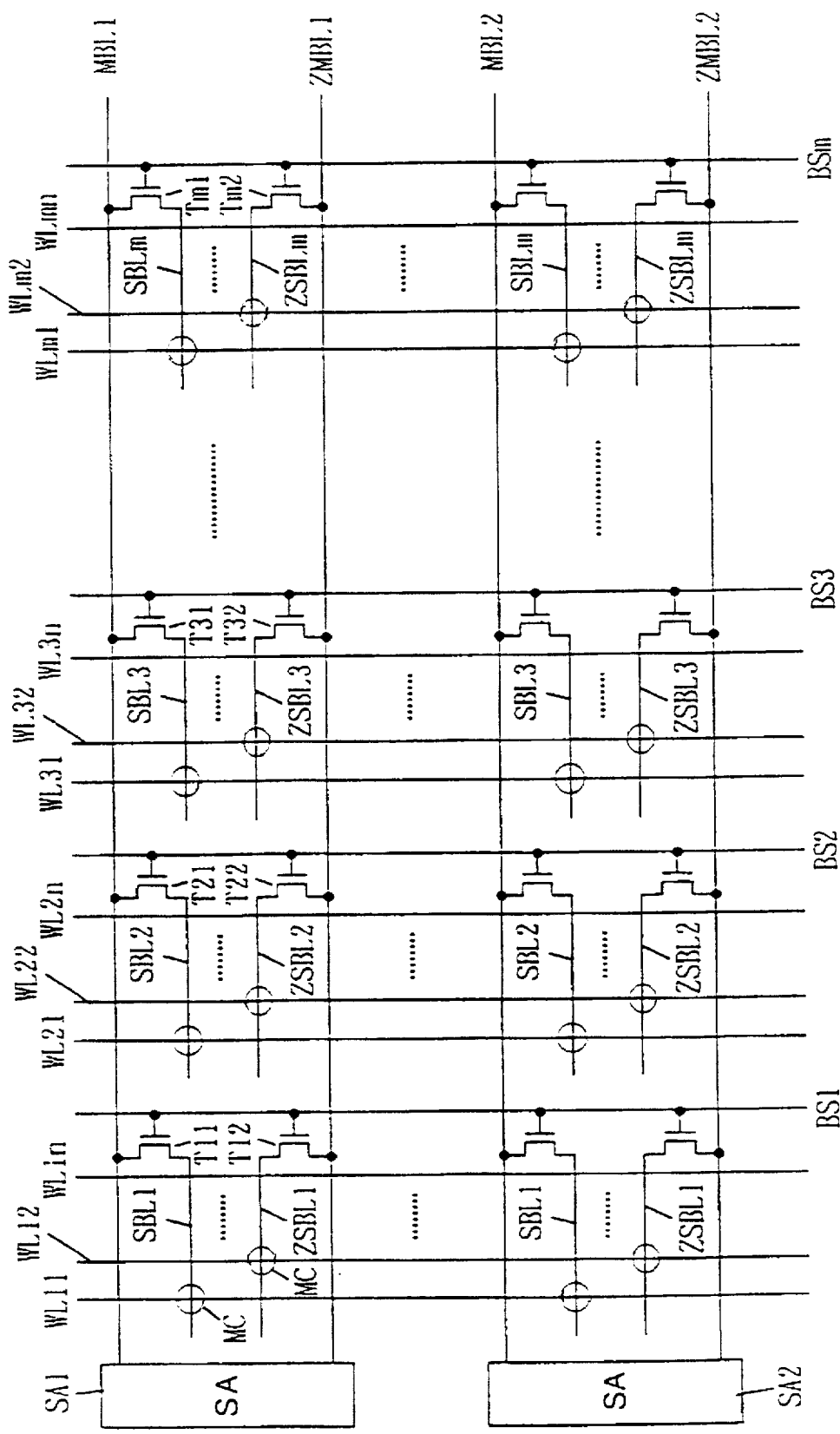
FIG. 29 shows a hierarchical bit line arrangement of a DRAM in the prior art.

FIG. 28 schematically shows an overall structure of the DRAM according to the invention. In FIG. 28, the DRAM includes memory cell arrays 60a and 60b each including memory cells disposed in a matrix form and having a hierarchical bit line arrangement. A block 65 including sense amplifiers and I/O gates is interposed between memory cell arrays 60a and 60b in view of the fact that main bit lines have the open bit line arrangement.

The DRAM further includes address buffer 40 receiving an external address and generating an internal address, a row decoder 61 decoding the internal row address sent from address buffer 40, a word driver 62 which transmits the word line drive signal onto the selected word lines in memory cell arrays 60a and 60b in accordance with a result of decoding provided from row decoder 61, a column decoder 63 decoding an internal column address signal sent from address buffer 40, and a block decoder 64 decoding row address signal bits (block address) sent from address buffer 40. The output of block decoder 64 is sent to the block select switch. The output of column decoder 63 is sent onto column select line (CSL). A specific structure of block decoder 64 depends on the arrangement or layout of sub-bit lines in memory cell arrays 60a and 60b (see FIGS. 26 and 27).

Column decoder 63 simultaneously selects a plurality of columns, i.e., a plurality of main bit lines. An I/O decoder (way decoder) 66 receives the predetermined address signal bits from address buffer 40, and selects the corresponding internal data line among a plurality of internal data lines to connect the same to an I/O circuit 67. I/O decoder 66 is not essential if the DRAM performs input/output of data in units of multiple bits and data is written into or read from only the simultaneously selected main bit lines. I/O circuit 67 transmits data between the internal data line selected by I/O decoder 66 and an external device.

The DRAM further includes a clock generating circuit 68 which generates various kinds of required internal clock signals in accordance with an external row address strobe signal /RAS, an external column address strobe signal /CAS, an external write enable signal /WE and an external output enable signal /OE. The DRAM performs the internal operation in accordance with the internal clock signals provided from clock generating circuit 68.

The embodiments have been described in connection with the bit line arrangement of the DRAM. The invention, however, can be applied to cache DRAM, synchronous DRAM and pseudo SRAMs (PSRAMs) as well as other types of semiconductor memory devices such as virtual SRAMs (VSRAMs) performing a dynamic operation.

According to the invention, as described hereinbefore, the "open bit line arrangement" is employed in which the main bit lines extend in opposite directions, i.e., one direction and the other direction with respect to the sense amplifier, and one main bit line is provided for each pair of sub-bit lines. Therefore, the pitch of main bit lines can be twice as large as the pitch of sub-bit lines, and thus can be remarkably increased. The invention specifically has the following major features.

(1) Both the main bit lines and the sub-bit lines are in the open bit arrangements, and each sub-bit line pair is connected to the corresponding main bit line via one corresponding switch. This eases conditions on the pitch of the switch elements in the extending direction of the word lines, and facilitates arrangement of the switching elements.

(2) One dummy cell is provided commonly for a plurality of sub-bit line pairs which are provided for one of the main bit lines, and another dummy cell is provided commonly for a plurality of sub-bit line pairs which are provided for the other main bit line. Therefore, only one dummy cell is provided for one main bit line, so that an area of the region for forming dummy cells is remarkably reduced, and thus an area occupied by the memory array can be reduced.

(3) The dummy cell is provided such that the dummy cell is coupled to only one of sub-bit line pairs related to one main bit line. Therefore, it is not necessary to provide the dummy cell for each sub-bit line pair, and thus the array area can be reduced.

(4) When selected, connection is made only to the main bit line. Therefore, it is not necessary to provide the dummy cell for each sub-bit line pair, and thus the area occupied by the memory array can be reduced.

(5) The dummy cell is isolated from the main bit line during the standby state, and, when the memory cell is selected, is coupled to the main bit line applying the reference potential to the main bit line to which data of the selected memory cell is transmitted. Therefore, the main bit line applying the reference potential can be set to bear the accurate reference potential, and the dummy cell can surely cancel the noises generated due to capacity-coupling between the selected word line and the sub-bit line via the selected memory cell. Therefore, the accurate sensing operation can be achieved.

(6) When data is transmitted to the main bit line from the selected memory cell, the dummy cell is isolated from this main bit line, and the noise having a phase opposite to that of the noise, which is generated due to capacity coupling between the word line and the sub-bit line main bit line, generates on the main bit line. Therefore, the influence by the capacity-coupling noise can be surely prevented and the sensing operation can be stably performed.

(7) Since only one of the paired sub-bit lines is connected to the main bit line, the total capacitance of bit lines can be further reduced, so that delay in propagation of signals on the bit lines can be reduced.

(8) The word lines and the lines for transmitting the switching element select signals have predetermined regions connected to the low resistance layers. Activation signals can be transmitted at a high speed to the selected word line and the selected switching element select signal transmission line, and the propagation delay times of signals on these signal lines can be equal to each other. Thereby, the main bit line and the selected sub-bit line can be connected to and isolated from each other at a high speed, so that the sensing timing can be advanced, and the access time can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

sense amplifier means having a first node and a second node for sensing and amplifying a potential difference between said first and second nodes;

a first main bit line extending in a first direction and coupled to said first node;

a second main bit line extending in a second direction opposite to said first direction and coupled to said second node;

a plurality of word lines each crossing said first or second main bit line;

a plurality of first sub-bit line pairs corresponding to said first main bit line and each including first and second sub-bit lines parallel to said first main bit line;

a plurality of second sub-bit line pairs corresponding to said second main bit line and each including third and fourth sub-bit lines parallel to said second main bit line;

a plurality of memory cells provided at crossings of said word lines and said first sub-bit line pairs and of said word lines and said second sub-bit line pairs, each of said memory cells being disposed such that one word line selects one memory cell related to one sub-bit line pair;

a plurality of switching elements, each of which is provided corresponding to the respective one of said plurality of first and second sub-bit line pairs for connecting a sub-bit line pair, which is connected to the memory cell connected to a selected word line, to the corresponding main bit line;

a first dummy cell provided commonly for said plurality of first sub-bit line pairs;

a second dummy cell provided commonly for said plurality of second sub-bit line pairs; and coupling means for connecting, when data of said memory cell selected onto one of said first and second main bit lines, the dummy cell, which is provided commonly for said sub-bit line pairs corresponding to the other main bit line, to said other main bit line.

2. A semiconductor memory device according to claim 1, wherein said first dummy cell is arranged such that, when selected, said first dummy cell is connected only to a predeterminally fixed one of said plurality of first sub-bit line pairs, and said second dummy cell is arranged such that, when selected, said second dummy cell is connected only to a predeterminally fixed one of said plurality of second sub-bit line pairs.

3. A semiconductor memory device according to claim 2, wherein said first dummy cell is arranged such that, when selected, said first dummy cell is coupled to said first main bit line through none of said first sub-bit line pairs, and said second dummy cell is arranged such that, when selected, said second dummy cell is coupled to said second main bit line pair through none of said second sub-bit line pairs.

4. A semiconductor memory device according to claim 1, wherein said coupling means isolates said first and second dummy cells from said first and second main bit lines, respectively, in a standby state, and couples said other main bit line to the corresponding dummy cell when the memory cell is selected.

5. A semiconductor memory device according to claim 1, wherein said coupling means couples said first and second dummy cells to said first and second main bit lines, respectively, in a standby state, and isolates said dummy cell provided correspondingly to said one main bit line from said first main bit line when the memory cell is selected.

6. A semiconductor memory device comprising:

sense amplifier means having a first node and a second node for sensing and amplifying a potential difference between said first and second nodes;

a first main bit line extending in a first direction and coupled to said first node;

a second main bit line extending in a second direction opposite to said first direction and coupled to said second node;

a plurality of word lines each crossing said first or second main bit line;

a plurality of first sub-bit line pairs corresponding to said first main bit line and each including first and second sub-bit lines parallel to said first main bit line;

a plurality of second sub-bit line pairs corresponding to said second main bit line and each including third and fourth sub-bit lines parallel to said second main bit line;

a plurality of memory cells provided at crossings of said word lines and said first sub-bit line pairs and of said word lines and said second sub-bit line pairs, each of said memory cells being disposed such that one word line selects one memory cell related to one sub-bit line pair; and a plurality of switching means, each of which is provided corresponding to the respective one of said plurality of first and second sub-bit line pairs for connecting a sub-bit line pair, which is connected to the memory cell connected to a selected word line, to the corresponding main bit line, wherein each of said switching means includes switching transistors which are provided correspondingly to the respective sub-bit lines of the corresponding sub-bit line pair and become conductive in response to different select signals, respectively.

7. A semiconductor memory device comprising:

sense amplifier means having a first node and a second node for sensing and amplifying a potential difference between said first and second nodes;

a first main bit line extending in a first direction and coupled to said first node;

a second main bit line extending in a second direction opposite to said first direction and coupled to said second node;

a plurality of word lines each crossing said first or second main bit line;

a plurality of first sub-bit line pairs corresponding to said first main bit line and each including first and second sub-bit lines parallel to said first main bit line;

a plurality of second sub-bit line pairs corresponding to said second main bit line and each including third and fourth sub-bit lines parallel to said second main bit line;

a plurality of memory cells provided at crossings of said word lines and said first sub-bit line pairs and of said word lines and said second sub-bit line pairs, each of said memory cells being disposed such that one word line selects one memory cell related to one sub-bit line pair;

a plurality of switching means, each of which is provided corresponding to the respective one of said plurality of first and second sub-bit line pairs for connecting a sub-bit line pair, which is connected to the memory cell connected to a selected word line, to the corresponding main bit line;

a first dummy word line provided crossing said first main bit line;

a first coupling means for capacitively coupling said first dummy word line to said first main bit line;

a second dummy word line provided crossing said second main bit line; and a second coupling means for capacitively coupling said second dummy word line to said second main bit line.

8. A semiconductor memory device according to claim 7, wherein said first coupling means comprises a first capacitor coupled between a sub-bit line of a predetermined one of said plurality of first sub-bit line pairs and said first dummy word line, and said second coupling means comprises a second capacitor coupled between said second dummy word line and a sub-bit line of a predetermined one of said plurality of second sub-bit line pairs.

9. A semiconductor memory device according to claim 8, wherein said first dummy word line is changed in potential when a word line crossing said second main bit line is selected, while said second dummy word line is changed in potential when a word line crossing said first main bit line is selected, and wherein a switching means provided for the sub-bit line of the predetermined one is rendered conductive when a corresponding dummy word line is changed in potential.

10. A semiconductor memory device according to claim 8, wherein said first dummy word line is changed in potential when a word line crossing said first main bit line is selected, while said second dummy word line is changed in potential when a word line crossing said second main bit line is selected, and wherein a switching means provided for the sub-bit line of the predetermined one is rendered conductive when a corresponding dummy word line is changed in potential.

11. A semiconductor memory device according to claim 7, wherein said first coupling means comprises a first capacitor coupled between said first dummy word line and said first main bit line and said second coupling means comprises a second capacitor coupled between said second main bit line and said second dummy word line.

12. A semiconductor memory device according to claim 11, wherein said first dummy word line is changed in potential when a word line crossing said second main bit line is selected, while said second dummy word line is changed in potential when a word line crossing said first main bit line is selected.

13. A semiconductor memory device according to claim 11, wherein said first dummy word line is changed in potential when a word line crossing said first main bit line is selected, while said second dummy word line is changed in potential when a word line crossing said second main bit line is selected.

14. A semiconductor memory device comprising:

sense amplifier means having a first node and a second node for sensing and amplifying a potential difference between said first and second nodes;

a first main bit line extending in a first direction and coupled to said first node;

a second main bit line extending in a second direction opposite to said first direction and coupled to said second node;

a plurality of word lines each crossing said first or second main bit line;

a plurality of first sub-bit line pairs corresponding to said first main bit line and each including first and second sub-bit lines parallel to said first main bit line;

a plurality of second sub-bit line pairs corresponding to said second main bit line and each including third and fourth sub-bit lines parallel to said second main bit line;

a plurality of memory cells provided at crossings of said word lines and said first sub-bit line pairs and of said word lines and said second sub-bit line pairs, each of said memory cells being disposed such that one word line selects one memory cell related to one sub-bit line pair; and a plurality of switching means, each of which is provided corresponding to the respective one of said plurality of first and second sub-bit line pairs for connecting a sub-bit line pair, which is connected to the memory cell connected to a selected word line, to the corresponding main bit line, wherein each of said first sub-bit line pairs and each of said second sub-bit line pairs form separate blocks, said semiconductor memory device further comprising, noise canceling means for canceling noise produced on data read out of a selected memory cell, said noise cancelling means including a first noise cancellation means provided commonly for said plurality of first sub-bit line pairs, second noise cancellation means provided commonly for said plurality of second sub-bit line pairs, and coupling means for connecting, when data of said memory cell selected is read onto one of said first and second main bit lines, the noise cancellation means, so as to cancel the noise on said data, said first noise cancellation means being provided in a first block having none of said plurality of memory cells, and said second noise cancellation means being provided in a second block having none of said plurality of memory cells.

15. A semiconductor memory device according to claim 14, wherein, and said coupling means selectively couples said first and second noise cancellation means to the first and second main bit lines so as to superimpose and anti-phase noise on said noise produced on data of the selected memory cell.

16. A semiconductor memory device according to claim 14, said coupling means selectively couples said first and second noise cancellation means to said first and second main bit lines so as to produce another noise of the same phase as said noise onto said first node of said sense amplifier when said data of said selected memory cell is transferred to said second node of said sense amplifier.

17. A semiconductor memory device according to claim 14, wherein said first and second noise cancellation means each includes means for transferring a reference potential to a corresponding one of said first and second nodes when coupled by said coupling means.

18. A semiconductor memory device having a plurality of memory cells arranged in rows and columns, on said column comprising:

sense amplifier means having a first node and a second node for sensing and amplifying a potential difference between said first and second nodes;

a first main bit line extending in a first direction and coupled to said first node;

a second main bit line extending on a second direction opposite to said first direction and coupled to said second node;

a plurality of word lines each crossing said first or second main bit line and connected at a predetermined region to a low resistance layer;

a plurality of first sub-bit line pairs corresponding to said first main bit line and each including first and second sub-bit lines parallel to said first main bit line;

a plurality of second sub-bit line pairs corresponding to said second main bit line and each including third and fourth sub-bit lines parallel to said second main bit line;

the plurality of memory cells provided correspondingly to crossings of said word lines and said first sub-bit line pairs and of said word lines and said second sub-bit line pairs, each of said memory cells being disposed such that one word line selects one memory cell related to one sub-bit line pair;

a plurality of switching elements, which are provided correspondingly to said plurality of first and second sub-bit line pairs for connecting said sub-bit line pair, which is connected to the selected memory cell, to the corresponding main bit line;

a plurality of switching element select signal transmission lines provided in parallel to said word lines and connected at predetermined regions to another low resistance interconnection layer and provided correspondingly to said plurality of switching elements; and means for transmitting an activation signal onto said word lines and said switching element select signal transmission lines in accordance with an address signal applied thereto.

19. A semiconductor memory device comprising:

a plurality of bit line pairs each including a main bit line extending in a first direction and a complementary main bit line extending in a second direction, opposite to said first direction;

a plurality of word lines each crossing the main bit lines or the complementary main bit lines of said plurality of bit line pairs;

a plurality of first sub-bit line pairs corresponding to each main bit line and each including first and second sub-bit lines parallel to said each main bit line;

a plurality of second sub-bit line pairs corresponding to each complementary main bit line and each including third and fourth sub-bit lines parallel to said each complementary main bit line;

a plurality of memory cells provided at crossings of said plurality of word lines and said plurality of first sub-bit line pairs and said plurality of second sub-bit line pairs, each of said memory cells being disposed such that one word line selects one memory cell related to one sub-bit line pair;

a plurality of sense amplifier means each provided corresponding to each bit line pair and a having a first node and a second node for sensing and amplifying a potential difference between said first and second nodes, a respective main bit line extending in said first direction coupled to said first node of a corresponding sense amplifier, and a respective complementary main bit line extending in said second direction coupled to said second node of said corresponding sense amplifier; and a plurality of switching transistors, each provided corresponding to a respective one of said plurality of first and second sub-bit line pairs for connecting said sub-bit line pair which is connected to said memory cell connected to the selected word line, to the corresponding main bit line or complementary main bit line.

20. A semiconductor memory device comprising:

sense amplifier means having a first node and a second node for sensing and amplifying a potential difference between said first and second nodes;

a first main bit line extending in a first direction and coupled to said first node;

a second main bit line extending in a second direction opposite to said first direction and coupled to said second node;

a plurality of word lines each crossing said first or second main bit line;

a plurality of first sub-bit line pairs corresponding to said first main bit line and each including first and second sub-bit lines parallel to said first main bit line;

a plurality of second sub-bit line pairs corresponding to said second main bit line and each including third and fourth sub-bit lines parallel to said second main bit line;

a plurality of memory cells provided at crossings of said word lines and said first sub-bit line pairs and of said word lines and said second sub-bit line pairs, each of said memory cells being disposed such that one word line selects one memory cell related to one sub-bit line pair; and a plurality of switching means, each of which is provided corresponding to the respective one of said plurality of first and second sub-bit line pairs for connecting a sub-bit line pair, which is connected to the memory cell connected to a selected word line, to the corresponding main bit line, wherein each of said first sub-bit line pairs and each of said second sub-bit line pairs form separate blocks, said semiconductor memory device further comprising, noise canceling means for canceling noise produced on data read out of a selected memory cell, said noise cancelling means including a first noise cancellation means provided commonly for said plurality of first sub-bit line pairs, and second noise cancellation means provided commonly for said plurality of second sub-bit line pairs, and coupling means for connecting, when data of said memory cell selected is read onto one of said first and second main bit lines, one of the noise cancellation means so as to cancel the noise on the data, said first noise cancellation means being provided in a first block including a first plurality of memory cells of said plurality of memory cells and being arranged such that, when selected, said first noise cancellation means is connected only to a predeterminally fixed one of said plurality of first sub-bit line pairs, and said second noise cancellation means being provided in a second block including a second plurality of memory cells of said plurality of memory cells and being arranged such that, when selected, said second noise cancellation means is connected only to a predeterminedly fixed one of said plurality of second sub-bit line pairs.

21. A semiconductor memory device according to claim 20, wherein said coupling means selectively couples said first and second noise cancellation means to said first and second main bit lines so as to superimpose an anti-phase noise on the noise on the data of the selected memory cell.

22. A semiconductor memory device according to claim 20, wherein said coupling means selectively couples said first and second noise cancellation means so as to produce another noise of the same phase as said noise on the data onto said first node of said sense amplifier when said data of said selected memory cell is transferred to said second node of said sense amplifier.

23. A semiconductor memory device according to claim 20, wherein said first and second noise cancellation means each include means for transferring a reference potential to the data of the selected memory cell to a corresponding one of said first and second nodes when selectively coupled by said coupling means.

24. A semiconductor memory device comprising:

sense amplifier means having a first node and a second node for sensing and amplifying a potential difference between said first and second nodes;

a first main bit line extending in a first direction and coupled to said first node;

a second main bit line extending in a second direction opposite to said first direction and coupled to said second node;

a plurality of word lines each crossing said first or second main bit line;

a plurality of first sub-bit line pairs corresponding to said first main bit line and each including first and second sub-bit lines shorter than and parallel to said first main bit line, the first and second sub-bit lines in a pair being provided adjacently with each other in a word line extending direction;

a plurality of second sub-bit line pairs corresponding to said second main bit line and each including third and fourth sub-bit lines shorter than and parallel to said second main bit line, the third and fourth sub-bit lines in a pair being provided adjacently with each other in the word line extending direction;

a plurality of memory cells provided at crossings of said word lines and said first sub-bit line pairs and of said word lines and said second sub-bit line pairs, each of said memory cells being disposed such that one word line selects one memory cell related to one sub-bit line pair; and a plurality of switching means, each of which is provided corresponding to the respective one of said plurality of first and second sub-bit line pairs for connecting a sub-bit line pair, which is connected to the memory cell connected to a selected word line, to the corresponding main bit line, said plurality of switching means are arranged such that switching means provided for adjacent sub-bit line pairs related to a common main bit line are provided adjacent with each other.

25. A semiconductor memory device comprising:

a plurality of sense amplifier means each having a first node and a second node for sensing and amplifying a potential difference between said first and second nodes;

a plurality of first main bit lines each extending in a first direction and coupled to said first node of a corresponding sense amplifier means;

a plurality of second main bit lines each extending in a second direction opposite to said first direction and coupled to said second node of a corresponding sense amplifier means;

a plurality of word lines each crossing said first or second main bit line;

a plurality of sets of a plurality of first sub-bit line pairs corresponding to each of said first main bit lines and each of the first sub-bit line pair including first and second sub-bit lines parallel to said first main bit lines;

a plurality of sets of a plurality of second sub-bit line pairs corresponding to each of said second main bit lines and each of the second sub-bit line pair including third and fourth sub-bit lines parallel to said second main bit lines;

a plurality of memory cells provided at crossings of said word lines and said first sub-bit line pairs and of said word lines and said second sub-bit line pairs, each of said memory cells being disposed such that one word line selects one memory cell related to one sub-bit line pair; and a plurality of switching means, each of which is provided corresponding to the respective one of said plurality of first and second sub-bit line pairs for connecting a sub-bit line pair, which is connected to the memory cell connected to a selected word line, to the corresponding main bit line, said plurality of switching means are arranged such that switching means provided for adjacent sub-bit lines related to adjacent main bit lines are provided at opposite ends of corresponding sub-bit lines, said adjacent main bit lines arranged adjacent in a word line extending direction.

26. A semiconductor memory device comprising:

a plurality of sense amplifier means each having a first node and a second node for sensing and amplifying a potential difference between said first and second nodes;

a plurality of first main bit lines each extending in a first direction and coupled to said first node of a corresponding sense amplifier;

a plurality of second main bit lines each extending in a second direction opposite to said first direction and coupled to said second node of a corresponding sense amplifier;

a plurality of word lines each crossing said first or second main bit line;

a plurality of sets of plurality of first sub-bit line pairs corresponding to each of said first main bit lines and each first sub-bit line pair including first and second sub-bit lines parallel to said first main bit lines;

a plurality of sets of plurality of second sub-bit line pairs corresponding to each of said second main bit lines and each second sub-bit line pair including third and fourth sub-bit lines parallel to said second main bit line;

a plurality of memory cells provided at crossings of said word lines and said first sub-bit line pairs and of said word lines and said second sub-bit line pairs, each of said memory cells being disposed such that one word line selects one memory cell related to one sub-bit line pair; and a plurality of switching means, each of which is provided corresponding to the respective one of said plurality of first and second sub-bit line pairs for connecting a sub-bit line pair, which is connected to the memory cell connected to a selected word line, to the corresponding main bit line, said plurality of switching means are arranged such that switching means provided for adjacent sub-bit line pairs related to a common main bit line are provided adjacent with each other and switching means provided for adjacent sub-bit lines related to adjacent main bit lines are provided at opposite ends of corresponding sub-bit lines, said adjacent main bit lines arranged adjacent in a word line extending direction.

* * * * *

UNITED STATES PATENT AND TRADEMARK OFFICE
CERTIFICATE OF CORRECTION

PATENT NO. : 5,682,343
DATED : October 28, 1997
INVENTOR(S) : Shigeki TOMISHIMA et al.

It is certified that error appears in the above-identified patent and that said Letters Patent is hereby corrected as shown below:

On cover page, item [54] and col. 1, line 2, after "MEMORY" insert
--DEVICE--.

Signed and Sealed this

Twenty-fourth Day of February, 1998

Attest:

BRUCE LEHMAN

*Attesting Officer*      *Commissioner of Patents and Trademarks*